United States Patent
Iqbal et al.

(10) Patent No.: US 11,443,792 B1
(45) Date of Patent: Sep. 13, 2022

(54) MEMORY CELL, MEMORY CELL ARRANGEMENT, AND METHODS THEREOF

(71) Applicant: Ferroelectric Memory GmbH, Dresden (DE)

(72) Inventors: Rashid Iqbal, Dresden (DE); Stefano Sivero, Comun Nuovo (IT); Stefan Ferdinand Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 17/400,411

(22) Filed: Aug. 12, 2021

(51) Int. Cl.
  *G11C 11/22* (2006.01)
  *H01L 27/11509* (2017.01)
  *H01L 29/78* (2006.01)
  *H01L 29/51* (2006.01)

(52) U.S. Cl.
  CPC ........ *G11C 11/2275* (2013.01); *G11C 11/221* (2013.01); *G11C 11/2255* (2013.01); *G11C 11/2257* (2013.01); *G11C 11/2297* (2013.01); *H01L 27/11509* (2013.01); *H01L 29/516* (2013.01); *H01L 29/78391* (2014.09)

(58) Field of Classification Search
  CPC .............. G11C 11/2275; G11C 11/221; G11C 11/2225; G11C 11/2257; G11C 11/2297; H01L 29/78391; H01L 27/11509; H01L 29/516
  USPC .................................................. 365/145, 63
  See application file for complete search history.

(56) References Cited

U.S. PATENT DOCUMENTS

| | | | | |
|---|---|---|---|---|
| 10,573,385 | B2 * | 2/2020 | Morris | G11C 14/0072 |
| 10,930,333 | B2 * | 2/2021 | Chen | H01L 29/516 |
| 10,998,339 | B2 * | 5/2021 | Morris | H01L 29/516 |
| 11,037,614 | B2 * | 6/2021 | Liu | G11C 11/2275 |
| 11,158,361 | B2 * | 10/2021 | Müller | G11C 11/2273 |
| 11,227,872 | B2 * | 1/2022 | Chang | H01L 29/6684 |
| 2002/0168785 | A1 * | 11/2002 | Paz de Araujo | H01L 29/40111 257/E21.208 |
| 2003/0235067 | A1 * | 12/2003 | Sakai | G11C 11/22 365/145 |

(Continued)

FOREIGN PATENT DOCUMENTS

| | | | | |
|---|---|---|---|---|
| EP | 357092 | B1 * | 10/1993 | C07C 67/08 |
| EP | 1244144 | A1 * | 9/2002 | G11C 11/22 |

(Continued)

OTHER PUBLICATIONS

Rashid Iqbal et al., "Two-Port Low-Power Gain-Cell Storage Array: Voltage Scaling and Retention Time", Jul. 19, 2019, 4 pages.

*Primary Examiner* — Viet Q Nguyen
(74) *Attorney, Agent, or Firm* — Hickman Becker Bingham Ledesma LLP; Malgorzata A. Kulczycka

(57) ABSTRACT

Various aspects relate to a memory cell including: a field-effect transistor memory structure, wherein a source/drain current through the field-effect transistor memory structure is a function of a gate voltage supplied to a gate of the field-effect transistor memory structure and a memory state in which the field-effect transistor memory structure is residing in; and an access device coupled to the gate of the field-effect transistor memory structure, wherein the access device is configured to control a voltage present at the gate of the field-effect transistor memory structure.

25 Claims, 11 Drawing Sheets

(56) References Cited

U.S. PATENT DOCUMENTS

| | | | | |
|---|---|---|---|---|
| 2006/0083098 A1* | 4/2006 | Ho | .................. | G11C 11/565 |
| | | | | 365/230.05 |
| 2012/0314476 A1* | 12/2012 | Appenzeller | ..... | H01L 29/78391 |
| | | | | 257/295 |
| 2020/0342932 A1* | 10/2020 | Bennett | ............... | G11C 11/4074 |
| 2021/0202689 A1* | 7/2021 | Thareja | ............. | H01L 27/11502 |
| 2021/0327901 A1* | 10/2021 | Noack | ................. | G11C 11/2273 |

FOREIGN PATENT DOCUMENTS

| | | | | |
|---|---|---|---|---|
| JP | 2001229685 A | * | 8/2001 | |
| WO | WO-2018063286 A1 | * | 4/2018 | ........... G11C 11/161 |

* cited by examiner

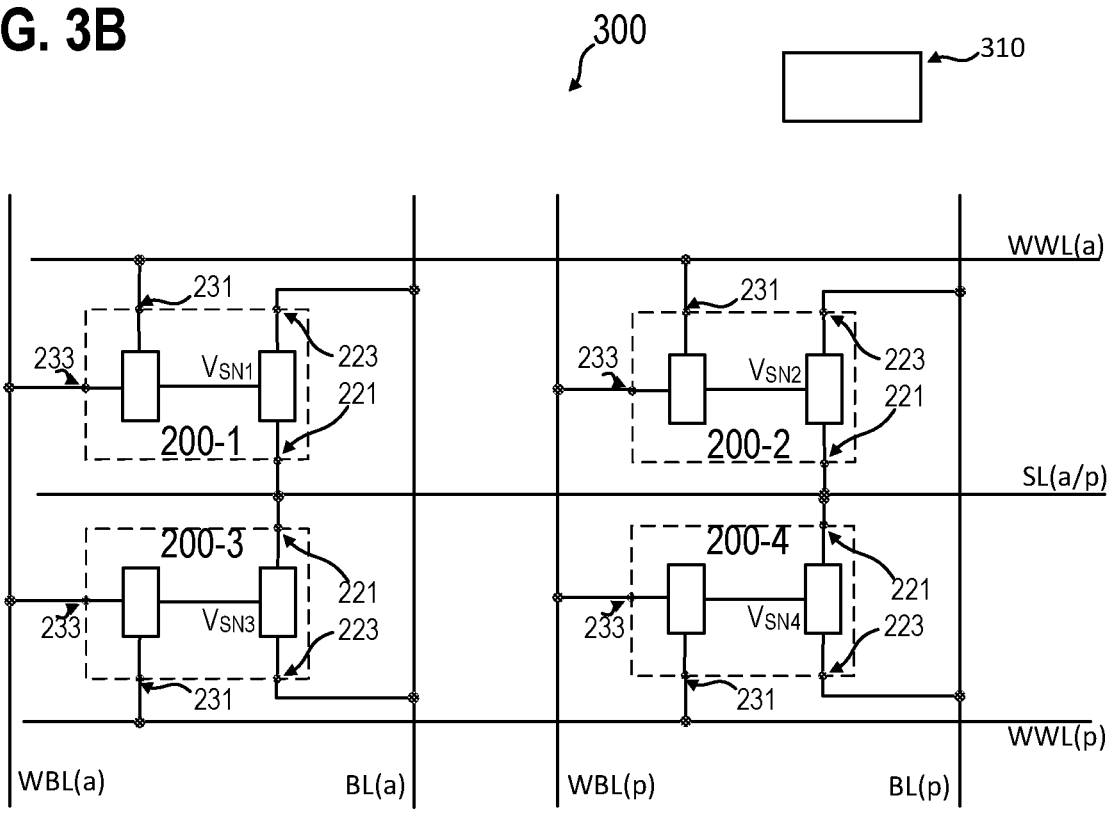
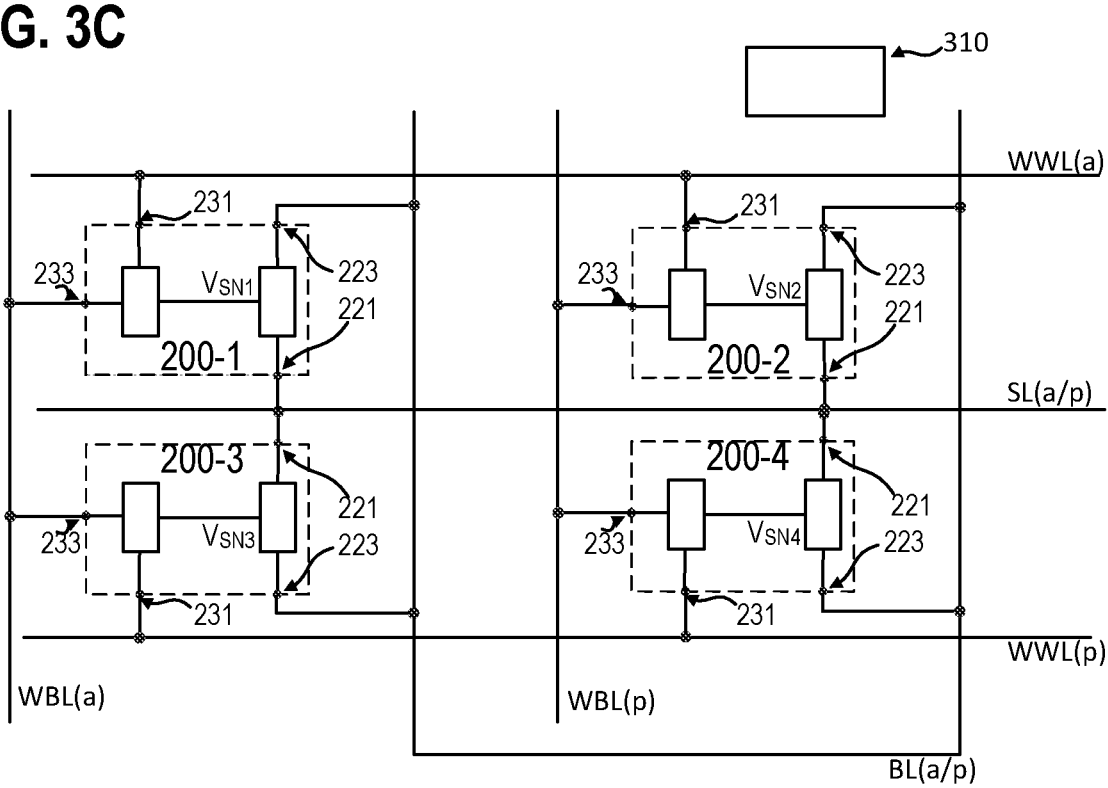

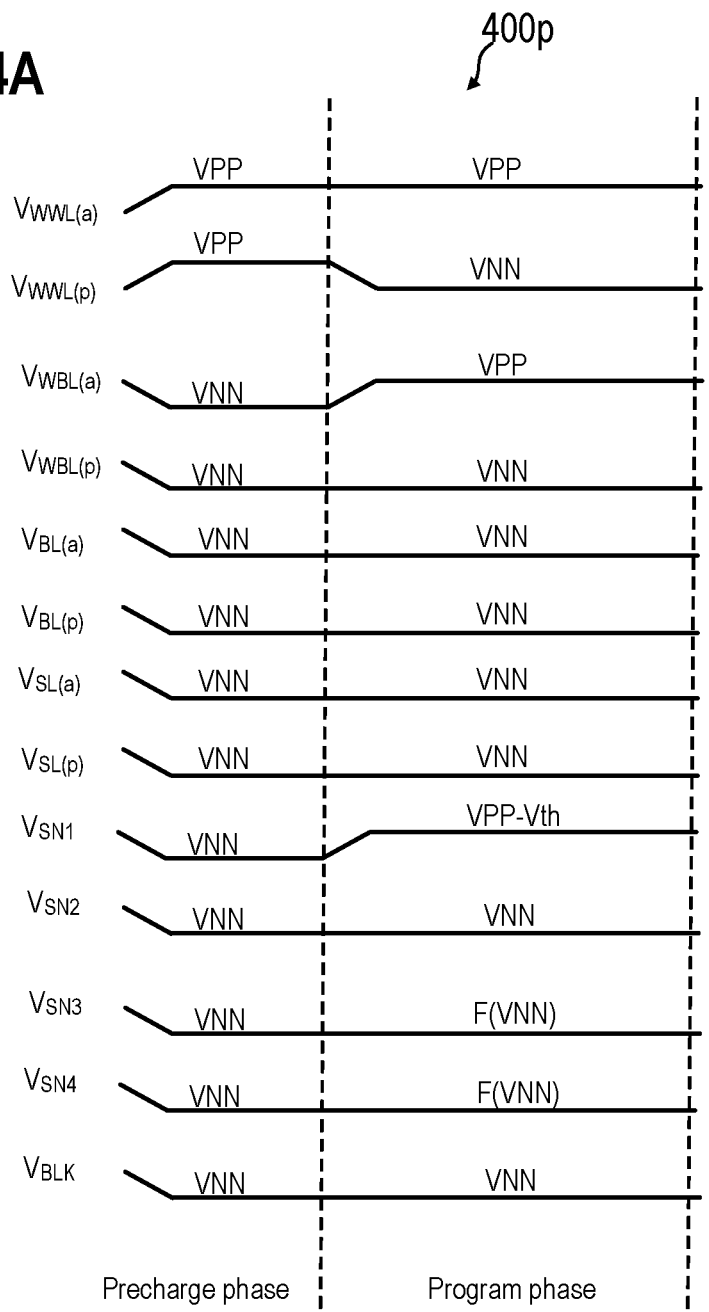

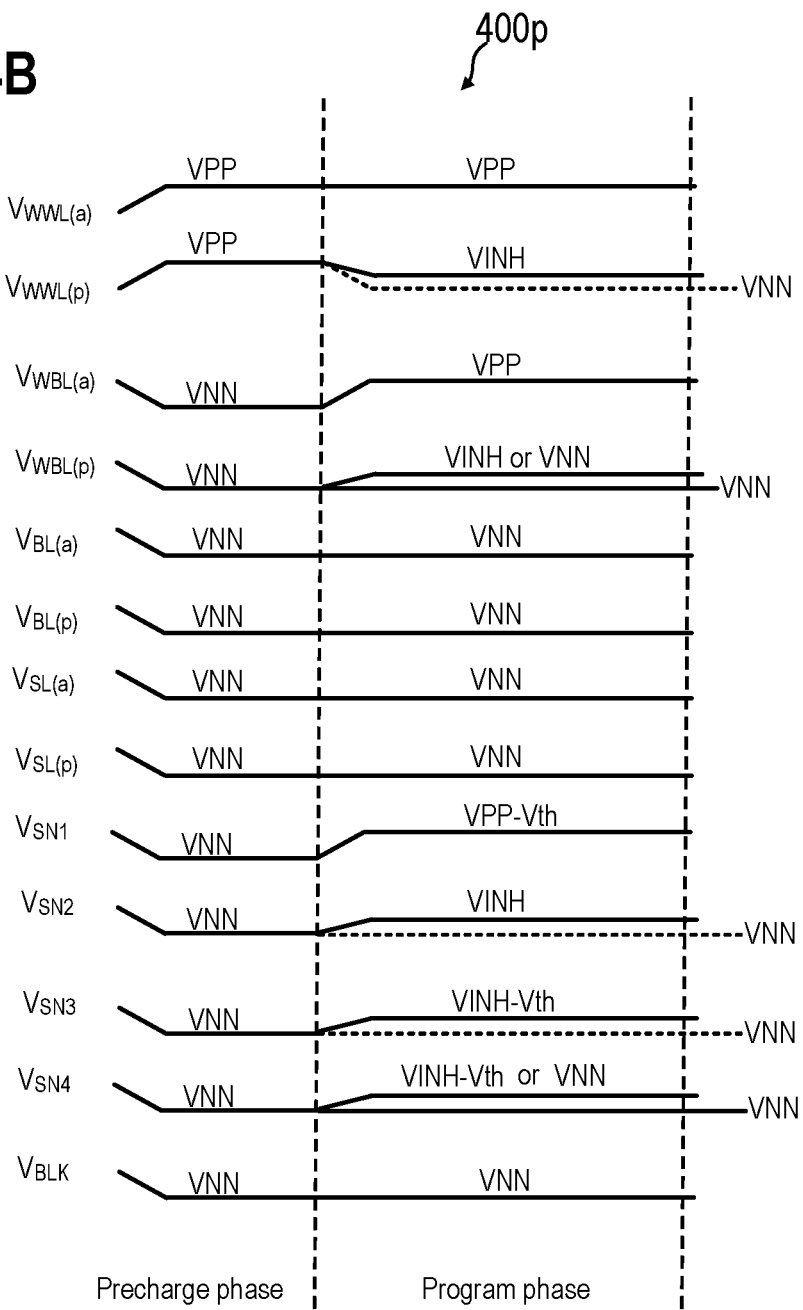

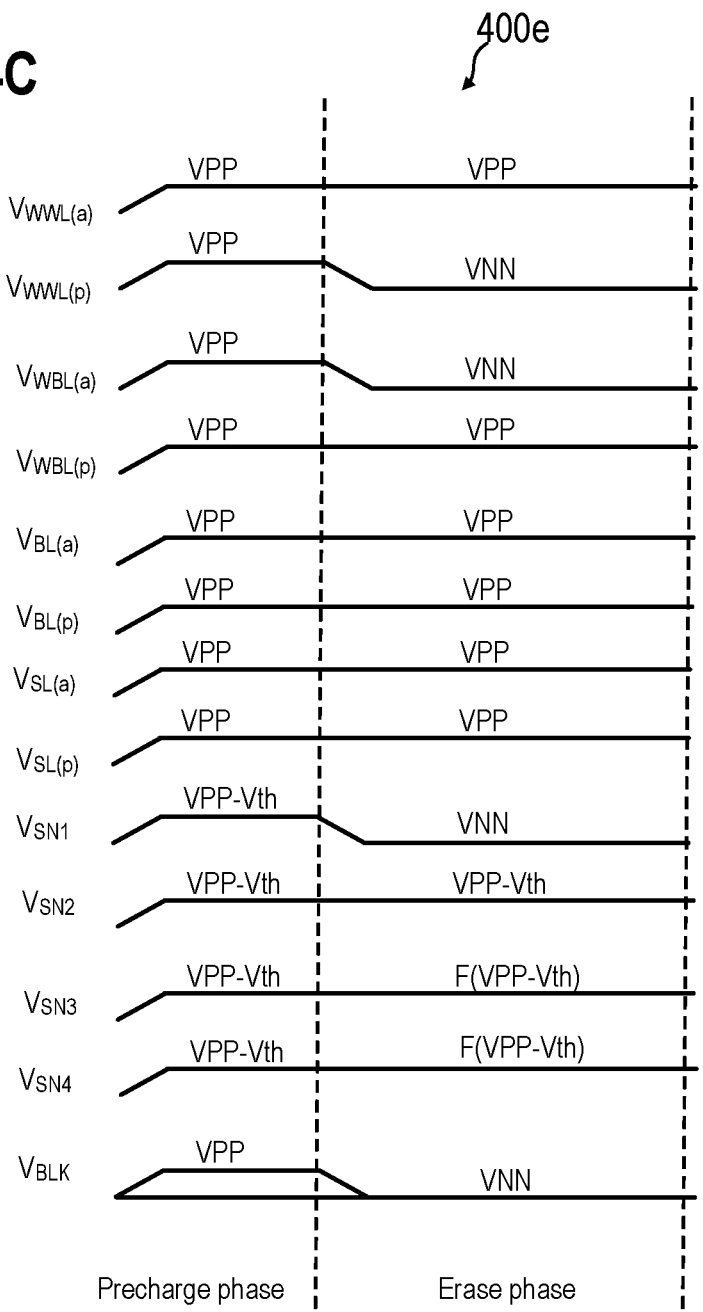

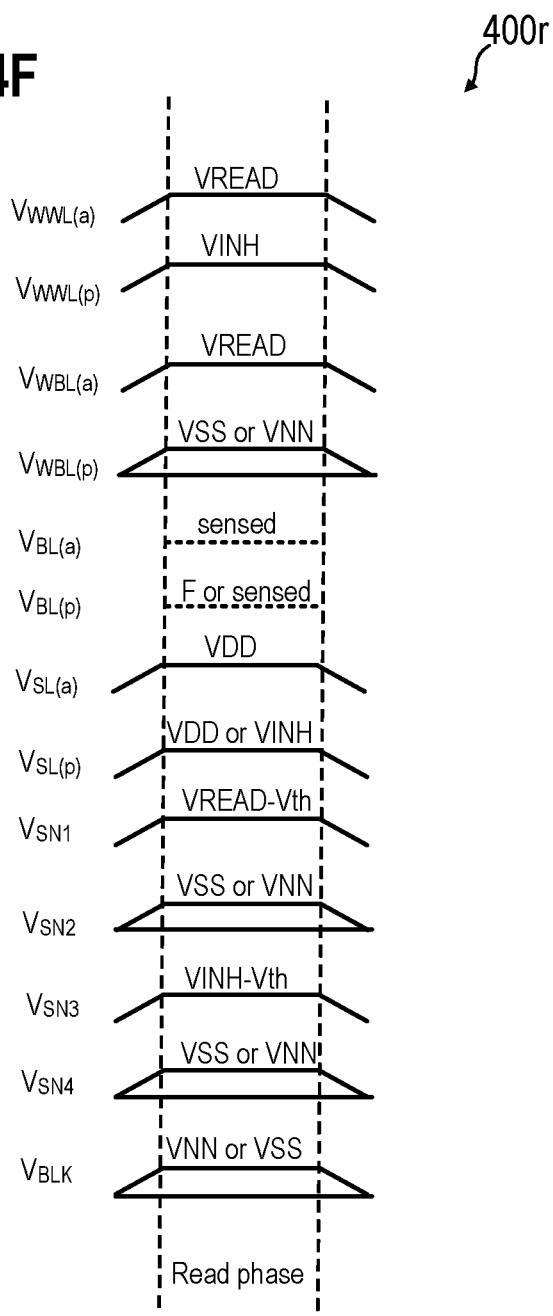

US 11,443,792 B1

MEMORY CELL, MEMORY CELL ARRANGEMENT, AND METHODS THEREOF

TECHNICAL FIELD

Various aspects relate to an electronic device or at least a part of an electronic device, e.g., to a memory cell, a memory cell arrangement, and methods for operating a memory cell or memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may be selectively in one of at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneously polarizable material, e.g., a ferroelectric material or a configuration of an antiferroelectric material, whose polarization state may be changed in a controlled fashion to store data in the memory cell, e.g. in a non-volatile manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 3A, FIG. 3B, and FIG. 3C show, in a schematic view, various aspects of a memory cell arrangement including a plurality of memory cells that have a two-element configuration;

FIG. 4A and FIG. 4B show, in a schematic view, various aspects of voltage schemes for writing, e.g., programming, a memory cell of a memory cell arrangement;

FIG. 4C and FIG. 4D show, in a schematic view, various aspects of voltage schemes for writing, e.g., erasing, a memory cell of a memory cell arrangement;

FIG. 4F shows, in a schematic view, various aspects of voltage schemes for reading a memory cell of a memory cell arrangement.

DESCRIPTION

Figure 1A:
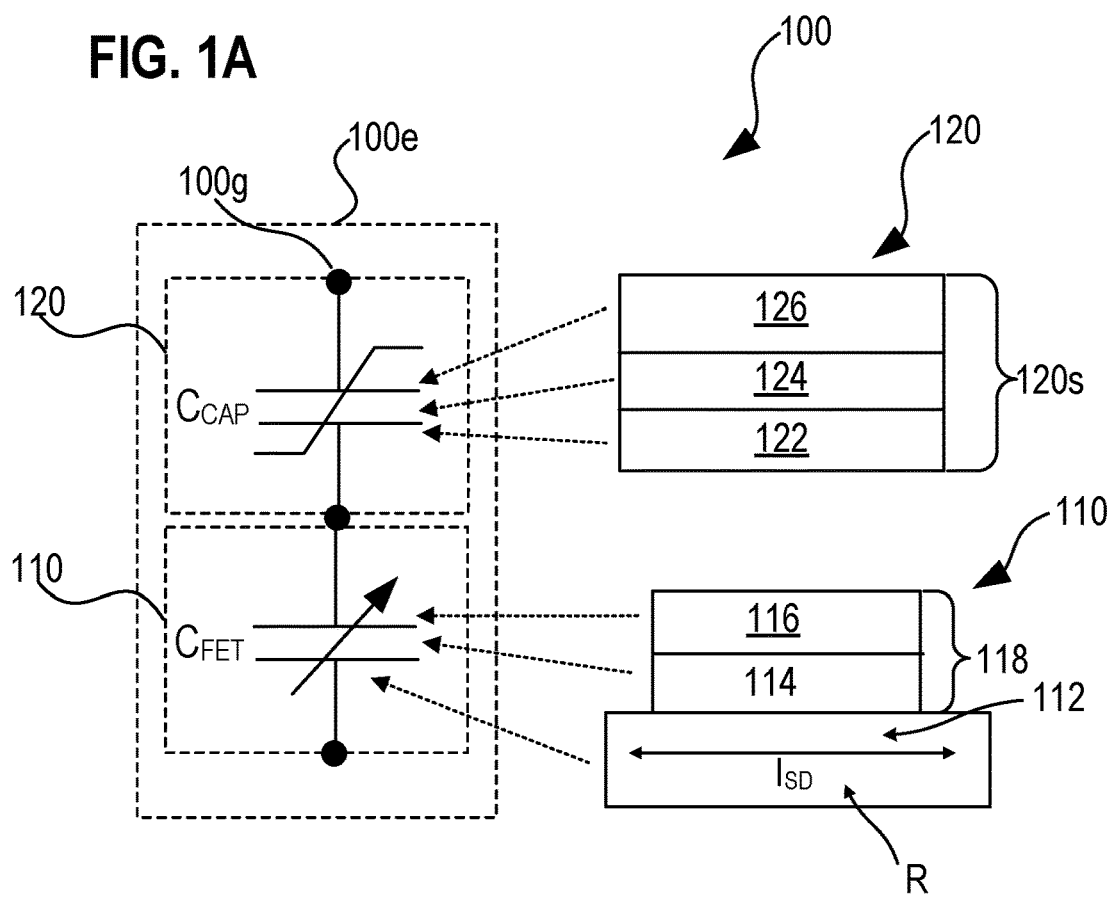
FIG. 1A and FIG. 1B show various aspects of a memory structure in a schematic view.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

Various aspects may be related to a memory cell implemented as a two element structure (e.g., a two-transistor structure referred to as (2T)-structure or (2T)-memory-architecture). The memory cell may include two transistor structures in a NOR-type arrangement, e.g., a memory transistor structure and an access transistor structure to control access to a gate (or another functional part) of the memory transistor structure. In some aspects, one transistor structure of the (2T)-structure, e.g., the memory transistor structure, may be implemented as or may include a ferroelectric field-effect transistor (FeFET) or any other type of field-effect transistor based memory cell that includes a capacitive memory structure, e.g., based on a spontaneously polarizable material. The other transistor structure of the (2T)-structure, e.g., the access transistor structure, may be implemented as or may include a field-effect transistor or any other access device that allows for a control of an access to the memory transistor structure, e.g., any access device that allows to control a gate voltage of a ferroelectric field-effect transistor. According to various aspects, the access transistor structure of the (2T)-structure may not include a ferroelectric field-effect transistor; or more generally, the access transistor structure of the (2T)-structure may not include memory properties with respect to its switching behavior.

The memory cell and memory cell arrangement (e.g., the (2T)-memory-architecture) may allow for a freedom to raise word-line voltages to program and read active memory cells that have a comparably high threshold voltage ($V_{th}$) without disturbing passive memory cells that have, for example, comparably low threshold voltages assuming that a certain variations in the threshold voltages of memory cells (e.g., of FeFET memory structures) of a memory arrangement cannot be prevented due to a non-ideal manufacturing. It may not be possible to program and read some worst (high $V_{th}$) memory cells without disturbing other passive memory cells in commonly used AND-architectures; however, this potential drawback can be avoided via the (2T)-memory-architecture described herein.

In some aspects, the (2T)-memory-architecture described herein may allow for a reduction of a number of voltage levels that may be necessary to operate (e.g., to write) a memory cell of a memory cell arrangement to only three voltage levels (e.g., VNN, VINH, and VPP), which may be less than used in commonly known field-effect transistor based memory architectures. As a comparison, four voltage levels (e.g., GND, 1/3VPP, 2/3VPP, and VPP) may be used in a standard 2/3 writing scheme for writing, for example, ferroelectric field-effect transistors in an array. The lower number of voltage levels to realize an operation of the (2T)-memory-architecture described herein may allow for a simplification in periphery circuits, e.g., in the voltage generation circuits (e.g., chare pumps).

In some other aspects, the (2T)-memory-architecture described herein may allow for a reduction of a number of voltage levels that may be necessary to operate (e.g., to write) a memory cell of the memory cell arrangement, e.g., to only two voltage levels (e.g., VNN and VPP) may be sufficient for a write operation, which is a lower number than used in commonly known memory architectures including field-effect transistor based memory cells. This lower number of voltage levels may allow for a simplification in periphery circuits, e.g., charge pumps, associated with (e.g., coupled to) the memory cell arrangement.

According to various aspects, voltage schemes for operating (e.g., writing and/or reading) a ferroelectric memory cell (e.g., a FeFET) or a similar memory cell (e.g., an anti-ferroelectric memory cell) within a memory cell arrangement (e.g., a voltage scheme for operating for operating a single memory cell, a so-called selected memory cell or active memory cell) may include voltages that inhibit writing of memory cells that are not intended to be written during a specific operation (e.g., so-called passive memory cells or non-selected memory cells may be prevented from changing undesirably their memory state during operating a selected memory cell). According to various aspects, the (2T)-memory-architecture described herein may operate in a controlled voltage-operating scheme in which each of the memory cells of a memory cell array is subjected to a desired set of operating voltages during operation. As an example, the (2T)-memory-architecture described herein may allow for increasing or selecting write voltages and/or read voltages without restrictions since a disturbance subjected to other memory cells is prevented due to the two-element configuration of the memory cells of the memory cell arrangement.

According to various aspects, the (2T)-memory-architecture described herein may allow for sharing source-lines and/or bit-lines, which may reduce the area consumption for implementing the memory cell arrangement.

According to various aspects, the (2T)-memory-architecture described herein may allow for a positive-source-drain-erase (PSDES), e.g., an efficient single bit erase can be realized.

According to various aspects, the (2T)-memory-architecture described herein may allow for a reduction of a column leakage current in the case that the source-lines and/or bit-lines are shared, which makes it possible still to read a memory cell despite sharing the bit-lines, for example.

According to various aspects, the (2T)-memory-architecture described herein may allow for a reduction or an avoidance of a reverse junction leakage.

According to various aspects, the (2T)-memory-architecture described herein may be implemented in fully depleted silicon-on-insulator (FDSOI) technology. In other words, the transistor structures of the memory cell described herein may be implemented in FDSOI technology as FDSOI transistor structures. An FDSOI transistor has an electrically insulated bulk region. In other aspects, if the bulk regions of the transistor structures of the memory cells are accessible, i.e., not electrically insulated, the bulk voltage present at the bulk regions may be controlled.

According to various aspects, the memory architecture described herein may be based on a four-terminal memory cells that includes a memory structure (e.g., a field-effect-transistor based memory structure) and an access device (e.g., a field-effect transistor) to control access to a functional part of the memory structure (e.g., to a gate of the field-effect-transistor based memory structure). The memory cell may include four nodes (also referred to as four terminals). The memory cell may include a source-line node (also referred to as source-line terminal or source terminal), a bit-line node (also referred to as bit-line terminal or drain-terminal), a word-line node (also referred to as word-line terminal or gate-terminal of the access device), and an operating-line node (referred to as operating-line terminal, operating-terminal, or source-terminal of the access device). Illustratively, the memory cell may be a four-node (e.g., four-terminal) memory cell. Therefore, four control lines may be used to address such a memory cell. Illustratively, each memory cell of a memory cell arrangement may be individually addressed via four corresponding control lines of four sets of control lines. The memory cell may include a field-effect transistor based memory structure. An example for a field-effect transistor based memory structure is a field-effect transistor based capacitive memory structure including a spontaneously polarizable layer, wherein a first source/drain node of the field-effect transistor based capacitive memory structure is electrically connected to or provides the source-line node of the memory cell, and wherein a second source/drain node of the field-effect transistor based capacitive memory structure is electrically connected to or provides the bit-line node of the memory cell. The memory cell may further include an access device coupled to a functional part of the memory structure, e.g., to a gate of the field-effect transistor based memory structure. The access device may be further coupled to or provide the word-line node of the memory cell; and the access device may be further coupled to or provide the operating-line node of the memory cell to control a voltage at the functional part of the memory structure (e.g., at the gate of the field-effect transistor based memory structure). The voltage at the functional part of the memory structure (e.g., at the gate of the field-effect transistor based memory structure) may be controlled based on both a word-line voltage supplied to (present at) the word-line node of the memory cell and an operating-line voltage supplied to (present at) at the operating-line node of the memory cell.

According to various aspects, the memory cell may include a field-effect transistor based capacitive memory structure including a field-effect transistor structure and a capacitive memory structure. The capacitive memory structure may be coupled to the field-effect transistor structure, e.g., to a gate of the field-effect transistor structure, and/or integrated in the field-effect transistor structure, e.g., integrated in a gate (e.g., in a gate stack) of the field-effect transistor structure.

Several aspects are described with reference to a structure (e.g., a memory transistor structure, e.g., a field-effect transistor structure, e.g., a ferroelectric field-effect transistor structure, e.g., a capacitive memory structure, e.g., an access transistor structure) and it is noted that such a structure may include solely the respective element (e.g., a memory transistor, e.g., a field-effect transistor, e.g., a ferroelectric field-effect transistor, e.g., a capacitive memory, e.g., an access transistor); or, in other aspects, a structure may include the respective element and one or more additional elements.

According to various aspects, a capacitive memory structure may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. According to various aspects, a field-effect transistor based capacitive memory structure may include a field-effect transistor structure and a capacitive memory structure coupled to or integrated in the field-effect transistor structure; or, in other aspects, a field-effect transistor based capacitive memory structure may include a field-effect transistor structure, capacitive memory structure, and one or more additional elements. According to various aspects, a field-effect transistor based capacitive memory structure may include a field-effect transistor structure and a capacitive memory element integrated in the field-effect transistor structure.

According to various aspects, a capacitive memory structure may include a functional layer (e.g., a capacitive memory element) in a capacitive environment, e.g., disposed between to electrode layers or disposed between an channel of a field-effect transistor and an electrode layer (e.g., a gate electrode of the field-effect transistor). According to various aspects, a functional layer of a memory structure, e.g., of a capacitive memory structure such as a field-effect transistor based capacitive memory structure, may be spontaneously polarizable. According to various aspects, a capacitive memory element of a memory structure, e.g., of a capacitive memory structure such as a field-effect transistor based capacitive memory structure, may be spontaneously polarizable. A spontaneously polarizable layer may show a hysteresis in the (voltage dependent) polarization. The spontaneously polarizable layer may show anti-ferroelectric properties, e.g., the spontaneously polarizable layer may have no or no substantial remanent polarization remaining in the case that no voltage drops over the spontaneously polarizable layer. In other aspects, the spontaneously polarizable layer may show ferroelectric properties, e.g., the spontaneously polarizable layer may have a remanent polarization or a substantial remanent polarization remaining in the case that no voltage drops over the spontaneously polarizable layer.

According to various aspects, a functional layer (e.g., a spontaneously polarizable layer) of a memory structure, e.g., of a capacitive memory structure, may include or may be made of a spontaneously polarizable (e.g., an anti-ferroelectric and/or ferroelectric) material. According to various aspects, a capacitive memory element of a memory structure, e.g., of a capacitive memory structure, may include or may be made of a spontaneously polarizable (e.g., an anti-ferroelectric and/or ferroelectric) material. An anti-ferroelectric material may show a hysteresis in the (voltage dependent) polarization, however, with no or no substantial remanent polarization remaining in the case that no voltage drops over the anti-ferroelectric material. A ferroelectric material may show a hysteresis in the (voltage dependent) polarization, however, with a (e.g., substantial) remanent polarization remaining in the case that no voltage drops over the ferroelectric material.

According to various aspects, in various types of applications, e.g., in memory technology, a remanent polarization as low as 0 $\mu C/cm^2$ to 3 $\mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 $\mu C/cm^2$ may be regarded as substantial remanent polarization. Such a substantial remanent polarization may allow for storing information as a function of a polarization state of a spontaneously polarizable layer or a spontaneously polarizable material.

A polarization capability of a material (dielectric, spontaneous, and remanent polarization) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a material may include transmission electron microscopy, e.g., an electric-field dependent transmission electron microscopy.

According to various aspects, a memory cell arrangement may include a plurality of memory cells as described herein according to various aspects. The memory cell arrangement may further include a memory control circuit and respective sets of control lines configured to operate the plurality of memory cells of the memory cell arrangement.

The memory cell described herein (e.g., the memory cell 200 shown in FIGS. 2A and 2B) may include a memory structure and an access device to access a functional part of the memory structure. The memory structure may be a field-effect transistor based memory structure including a field-effect transistor structure and at least one memory element. The memory structure may be a field-effect transistor based capacitive memory structure including a field-effect transistor structure and at least one capacitive memory structure coupled to or integrated in the field-effect transistor structure, as explained in more detail below. It is noted that despite various aspects of the memory cell and memory cell arrangement are described herein with reference to a field-effect transistor based capacitive memory structure (such as a FeFET) and a field-effect transistor structure as an access device to access gate of the field-effect transistor based capacitive memory structure, other memory structures and/or other access devices may be suitable as well.

Figure 1B:
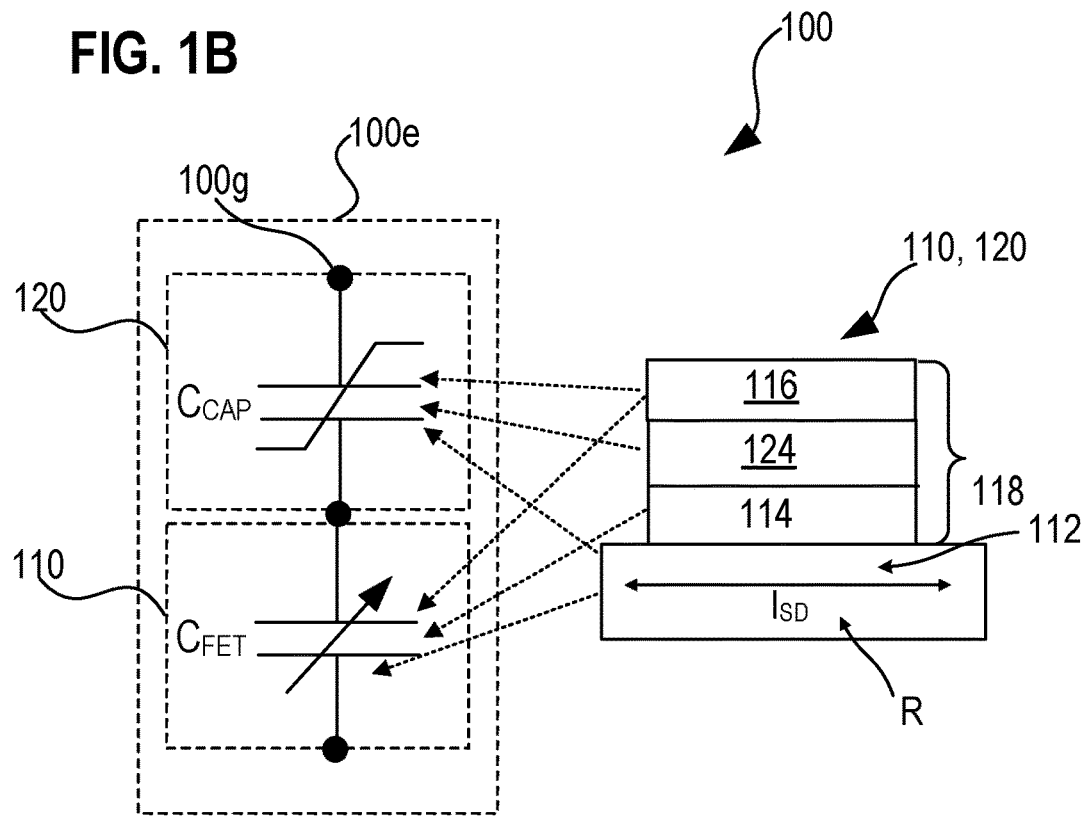

FIG. 1A and FIG. 1B show respectively various aspects of a memory structure 100. The memory structure 100 may be a field-effect transistor based capacitive memory structure, according to various aspects. The memory structure 100 may include a field-effect transistor structure 110 and a capacitive memory structure 120. In some aspects, the capacitive memory structure 120 may be coupled to the field-effect transistor structure 110, see FIG. 1A, or the capacitive memory structure 120 may be, in other aspects, integrated into the field-effect transistor structure 110, see FIG. 1B. Basically, the memory structure 100 may include a field-effect transistor structure and a memory element (e.g., a spontaneously polarizable layer).

As illustrated in FIG. 1A, the capacitive memory structure 120 may include at least two electrodes 122, 126 (e.g., two electrode layers) and a memory element 124 coupled to the at least two electrodes 122, 126. The memory element 124 may include or may be a functional layer disposed between two electrodes 122, 126. The memory element 124 may include or may consist of any type of suitable memory material, as for example, a spontaneously polarizable material (e.g., a remanent polarizable material, e.g., a ferroelectric or anti-ferroelectric material). According to various aspects, the memory element 124 may be a capacitive memory element including, for example, an electrically non-conductive material such as a spontaneously polarizable material (e.g., a ferroelectric or anti-ferroelectric material). The capacitive memory structure 120 in a capacitive configuration may have a capacitance, $C_LAP$, associated therewith (see equivalent circuit 100e with respect to the capacitive properties). The two electrodes 122, 126 and the memory element 124 may form a memory layer stack 120s. In some aspects, the memory layer stack 120s may be a planar layer stack; however, other shapes may be suitable as well, e.g., curved shapes, angled shapes, coaxially aligned shapes, as examples.

The field-effect transistor structure 110 may include a gate structure 118, wherein the gate structure 118 may include a gate isolation 114 and a gate electrode 116. The gate structure 118 is illustrated exemplarily as a planar gate stack; however, it may be understood that the planar configuration shown in FIG. 1A is an example, and other field-effect transistor designs may include a gate structure 118 with a non-planar shape, for example a trench gate transistor design, a vertical field-effect transistor design, or other designs, such as a fin-FET design. The gate structure 118 may define a channel region 112, e.g., provided in a semiconductor portion (e.g., in a semiconductor layer, in a semiconductor die, etc.). The gate structure 118 may allow for a control of an electrical behavior (e.g., a resistance R) of the channel region 112, e.g., a current flow in the channel region 112 may be controlled (e.g., allowed, increased, prevented, decreased, etc.). In some aspects, the gate structure 118 may, for example, allow to control (e.g., allow or prevent) a source/drain current, ISD, from a first source/drain region of the field-effect transistor structure 110 to a second source/drain region of the field-effect transistor structure 110 (the source/drains are provided in or adjacent to the channel but are not shown in FIG. 1A). The channel region 112 and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided at the gate electrode 116 to control the current flow, ISD, in the channel region 112, the current flow, ISD, in the channel region 112 being caused by voltages supplied via the source/drain regions. The gate electrode 116 may include an electrically conductive material. According to various aspects, the gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers, as an example.

In some aspects, the gate electrode 116 of the field-effect transistor structure 110 and the electrode 122 of the capacitive memory structure 120 that is connected to the field-effect transistor structure 110 may be spatially separated from one another and electrically connected via a conductive connection, e.g., one or more metal lines. In other aspects, the gate electrode 116 of the field-effect transistor structure 110 and one of the at least two electrodes 122, 126 of the capacitive memory structure 120 may be in direct physical contact with one another or implemented as a single (shared) electrode.

In other aspects, the capacitive memory structure 120 may be integrated in the field-effect transistor structure 110, as illustrated in FIG. 1B. In this case, the memory element 124 may be integrated in the gate structure 118 of the field-effect transistor structure 110 and, a capacitive memory structure 120 is formed by the memory element 124 disposed between the channel region 112 and the gate electrode 116 in a similar way (cf. equivalent circuits 100e in FIG. 1A and FIG. 1B) as described with reference to FIG. 1A.

According to various aspects, the field-effect transistor structure 110 and the capacitive memory structure 120 form together a field-effect transistor based (e.g., capacitive) memory structure, as exemplarily shown in FIGS. 1A and 1B. According to various aspects, a gate 100g of the field-effect transistor based (e.g., capacitive) memory structure may be provided by the gate electrode 116 (see FIG. 1B) or, in other configurations, by an electrode 126 of the capacitive memory structure 120 (see FIG. 1A).

In the following, various aspects of a memory cell and a memory cell arrangement are described in more detail. The memory cell may include a field-effect transistor based capacitive memory structure as described above with reference to the memory structure 100, according to various aspects. The memory cell or the memory cell arrangement described herein may be used in connection with any type of suitable memory controller, e.g., a memory controller that may generate only two or only three different voltage levels for writing the memory cell (e.g., for writing one or more memory cells of a memory cell arrangement). However, in other aspects, more than four different voltage levels may be used for operating (e.g., for reading) the memory cell or for operating one or more memory cells of a memory cell arrangement.

According to various aspects, the memory cell and the memory cell arrangement described herein may be configured complementary metal oxide semiconductor (CMOS) compatible, e.g., including standard CMOS-materials only and may require no special integration considerations (e.g., no special thermal budget which may avoid diffusion and/or contamination during manufacturing). CMOS compatible spontaneously polarizable materials may be used to implement the one or more memory cell based on, for example, $HfO_2$ and/or $ZrO_2$. Doped $HfO_2$ (e.g., $Si:HfO_2$ or $Al:HfO_2$) or other suitable spontaneously polarizable materials may allow for an integration of the spontaneously polarizable layer via known integration schemes.

Figure 2A:
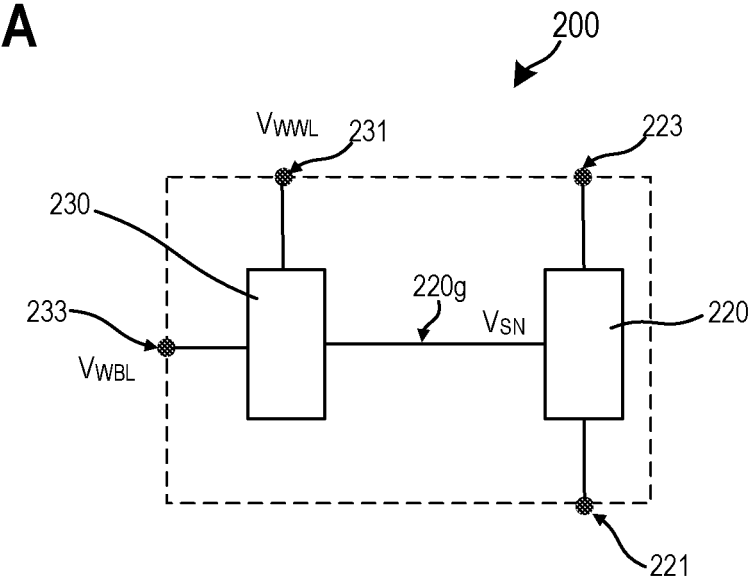
FIG. 2A and FIG. 2B show, in a schematic view, various aspects of a memory cell in a two-element configuration.

FIG. 2A shows a schematic view of a memory cell 200, according to various aspects. The memory cell 200 may be configured as a four-node memory cell (also referred to as four-terminal device), e.g., having a first node (e.g., a source-line node) 221, a second node (e.g., a bit-line node) 223, a third node (e.g., a word-line node) 231, and a fourth node (e.g., an operating-line node) 233. According to various aspects, the memory cell 200 may further include a memory structure 220, e.g., a field-effect transistor memory structure (also referred to as field-effect transistor based memory structure). The memory structure 220 may include or may be a field-effect transistor based capacitive memory structure, e.g., configured as described herein with reference to the memory structure 100, see FIG. 1A and/or FIG. 1B, for example. According to various aspects, the memory cell 200 may further include an access device 230, e.g., an access transistor 230t, e.g., an access field-effect transistor 230t FET. The access device 230 may be coupled to the memory structure 220. The access device 230 may be further coupled to the word-line node 231 and to the operating-line node 233 to control a voltage $V_{SN}$ supplied to the memory structure 220 as a function of both a word-line voltage $V_{WWL}$ provided at the word-line node 231 and an operating-line voltage $V_{WBL}$ provided at the operating-line node 233.

According to various aspects, the memory cell 200 may have a two-transistor-(2T)-configuration. The memory cell 200 may include (e.g., may consist of) two transistor structures, e.g., two field-effect transistor structures. According to various aspects, a field-effect transistor memory structure (e.g., a ferroelectric field-effect transistor) of the memory cell 200 may be an example for the memory structure 220 of the memory cell 200 and an access field-effect transistor structure of the memory cell 200 may be an example for the access device 230 of the memory cell 200 (see FIG. 2B).

According to various aspects, the memory structure 220 of the memory cell 200 may be a field-effect transistor based capacitive memory structure including a field-effect transistor structure 110 and a capacitive memory structure 120, e.g., as described above with reference to the field-effect transistor based capacitive memory structure.

Figure 2B:
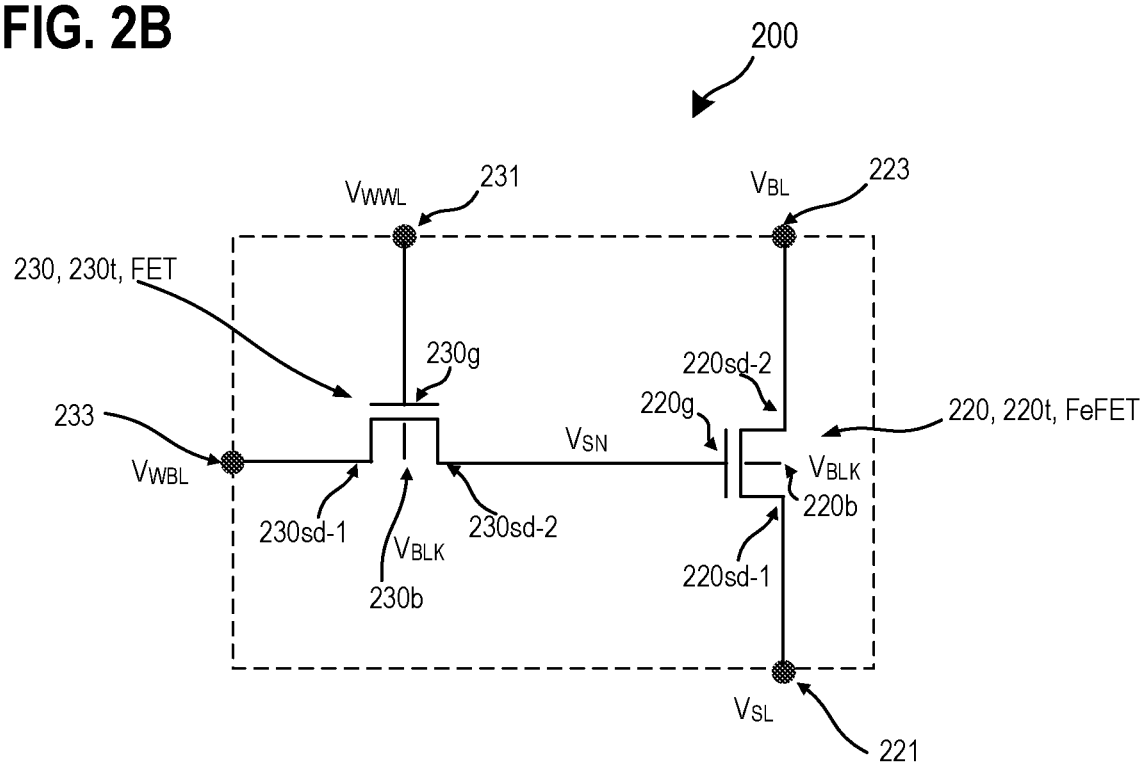

As illustrated in FIG. 2B, the memory cell 200 may include a field-effect transistor memory structure 220t (e.g., a FeFET) (having, for example, a memory function) and an access field-effect transistor structure 230t (having, for example, no memory function). Various aspects of the present disclosure are described—by way of example—for a memory cell 200 that includes (e.g., consist of) a memory (e.g., ferroelectric) field-effect transistor 220t and an access field-effect transistor 230t, wherein the access field-effect transistor is coupled to a gate of the memory field-effect transistor, wherein the memory field-effect transistor provides that actual memory function of the memory cell 200. However, it is noted that other memory structures 220 and/or other access devices 230 may be used in the same or on a similar way to realize the memory cell 200 having a two-transistor or two-transistor-like configuration.

As illustrated in FIG. 2B, a first source/drain node 220sd-1 of the field-effect transistor memory structure 220t may be coupled to the source-line node 221 and a second source/drain node 220sd-2 of the field-effect transistor memory structure may be coupled to the bit-line node 223. The field-effect transistor memory structure 220t may include a gate 220g (e.g., a gate node, e.g., a gate electrode layer) that controls an electric characteristic of a channel of the field-effect transistor memory structure 220t (e.g., a current flow through the channel of the field-effect transistor memory structure 220t, e.g., an electrical resistance of the channel of the field-effect transistor memory structure 220t, e.g., e.g., a current flow between the source-line node 221 and bit-line node 223). The field-effect transistor memory structure 220t may be configured as described with reference to the field-effect transistor based capacitive memory structure 100 having a capacitive memory structure 120 coupled to or integrated in a gate of a field-effect transistor structure 110.

As further illustrated in FIG. 2B, a first source/drain node 230sd-1 of the access field-effect transistor structure 230t may be coupled to the operating-line node 233 and a second source/drain node 230sd-1 of the access field-effect transistor structure 230t may be coupled to the to a gate 220g (e.g., to the gate node, e.g., the gate electrode layer) of the field-effect transistor memory structure 220t. A gate 230g (e.g., a gate node, e.g., a gate electrode layer) of the access field-effect transistor structure 230t may be coupled to the word-line node 132. According to various aspects, the memory cell 200 (e.g., the field-effect transistor memory structure 220t and the access field-effect transistor structure 230t) may be configured to control a voltage $V_{SN}$ at the gate 220g of the field-effect transistor memory structure 220t (e.g., at the gate of the FeFET) based on both a word-line voltage $V_{WWL}$ provided at the word-line node 231 and an operating-line voltage $V_{WBL}$ provided at the operating-line node 233. The voltage $V_{SN}$ at the gate 220g of the field-effect transistor memory structure 220t (e.g., together with a voltage source-line voltage $V_{SL}$ provided at the source-node 221 of the memory cell 200, a bit-line voltage $V_{BL}$ provided at the bit-line node 223, and optionally a bulk voltage $V_{BLK}$ provided at an optional bulk node 220b of the field-effect transistor memory structure 220t) may control a current flow from the source-line node 221 to the bit-line node 223 and/or from the bit-line node 223 to the source-line node 221 as a function of a memory state of the field-effect transistor memory structure 220t. The memory state of the field-effect transistor memory structure 220t may be defined by a state of a memory element (e.g., a spontaneously polarizable layer such as a ferroelectric layer) of the field-effect transistor memory structure 220t. The current flow from the source-line node 221 to the bit-line node 223 and/or from the bit-line node 223 to the source-line node 221 as a function of a memory state of the field-effect transistor memory structure 220t may be used to determine an actual memory state in which the field-effect transistor memory structure 220t (and therefore the memory cell 200) is residing in (referred to as reading or read operation).

Furthermore, the voltage $V_{SN}$ at the gate 220g of the field-effect transistor memory structure 220t (e.g., together with a voltage source-line voltage $V_{SL}$ provided at the source-node 221 of the memory cell 200, a bit-line voltage $V_{BL}$ provided at the bit-line node 223, and optionally a bulk voltage $V_{BLK}$ provided at an optional bulk node 220b of the field-effect transistor memory structure 220t) may allow for writing (e.g., programming and/or erasing) the memory cell 200 and/or for inhibit a writing (e.g., a programming and/or erasing) of the memory cell 200.

According to various aspects, the gate 220g of the field-effect transistor memory structure 220t may be electrically floating in the case that the access field-effect transistor structure 230t is closed. However, a voltage level supplied to the gate 220g of the field-effect transistor memory structure 220t can be defined by passing a predefined voltage to the gate 220g of the field-effect transistor memory structure 220t with the access field-effect transistor structure 230t being open during a pre-writing operation such that the desired voltage level is present at the gate 220g of the field-effect transistor memory structure 220t during a subsequent writing operation corresponding to the pre-writing operation.

According to various aspects, a bulk voltage $V_{BLK}$ may be optionally provided at an optional bulk node 230b of the access field-effect transistor structure 230t. According to various aspects, a bulk voltage $V_{BLK}$ may be optionally provided at an optional bulk node 220b of the field-effect transistor memory structure 220t. This may allow for a single-bit positive source/drain erase of the field-effect transistor memory structure 220t by controlling the operating of the access field-effect transistor structure 230t based on the bulk voltage $V_{BLK}$, the operating-line voltage $V_{WBL}$, and the word-line voltage $V_{WWL}$ provided to the access field-effect transistor structure 230t.

According to various aspects, a memory control circuit may be coupled to the memory cell 200 and configured to operate the memory cell 200. Operating a memory cell may include writing (e.g., programming and/or erasing) and reading the memory cell. According to various aspects, the memory cell 200 may be written by providing a set of voltages at the four-nodes of the memory cell 200. Since the memory information is stored in the memory structure 220, 220t, FeFET of the memory cell 200, the gate voltage $V_{SN}$, the source-line voltage $V_{SL}$, and the bit-line voltage $V_{BL}$ may define whether or not the memory state of the memory cell is changed, i.e., whether or not the memory cell is written, or whether or not the memory cell 200 is read out. The gate 220g (e.g., the gate terminal, the gate node, the gate line) of the memory cell 200 may be electrically floating as long as the access device 230, 230t, FET is in an "off"-state; however, the gate 220g can be brought into predefined conditions (e.g., charged to a pre-defined voltage $V_{SN}$) in a pre-writing or pre-reading operation before the memory cell 200 is written or read out.

According to various aspects, the term "coupled to" used herein with reference to functional parts of the memory structure 220, 220t, FeFET and/or the access device 230, 230t, FET (e.g., source/drain regions, source/drain nodes, gate electrodes, gate nodes, and the like) that are coupled a respective nodes (e.g., source-line node, bit-line node, word-line node, operating-line node) of the memory cell 200 may be understood as follows: the respective functional parts are electrically conductively connected to corresponding nodes and/or the respective functional parts itself provide the corresponding nodes. As an example, a gate 230g of the access field-effect transistor structure 230t may be electrically conductively connected to the word-line node 231 of the memory cell 200 or the gate 230g of the access field-effect transistor structure 230t may provide the word-line node 231 of the memory cell 200. As another example, a source/drain node 230sd-1 of the access field-effect transistor structure 230t may be electrically conductively connected to the operating-line node 233 of the memory cell 200 or the source/drain node 230sd-1 of the access field-effect transistor structure 230t may provide the operating-line node 233 of the memory cell 200. As another example, a source/drain node 220sd-1 of the field-effect transistor memory structure 220t may be electrically conductively connected to the source-line node 221 of the memory cell 200 or the source/drain node 220sd-1 of the field-effect transistor memory structure 220t may provide the source-line node 221 of the memory cell 200. As another example, a source/drain node 220sd-2 of the field-effect transistor memory structure 220t may be electrically conductively connected to the bit-line node 223 of the memory cell 200 or the source/drain node 220sd-2 of the field-effect transistor memory structure 220t may provide the bit-line node 221 of the memory cell 200.

Figure 2C:
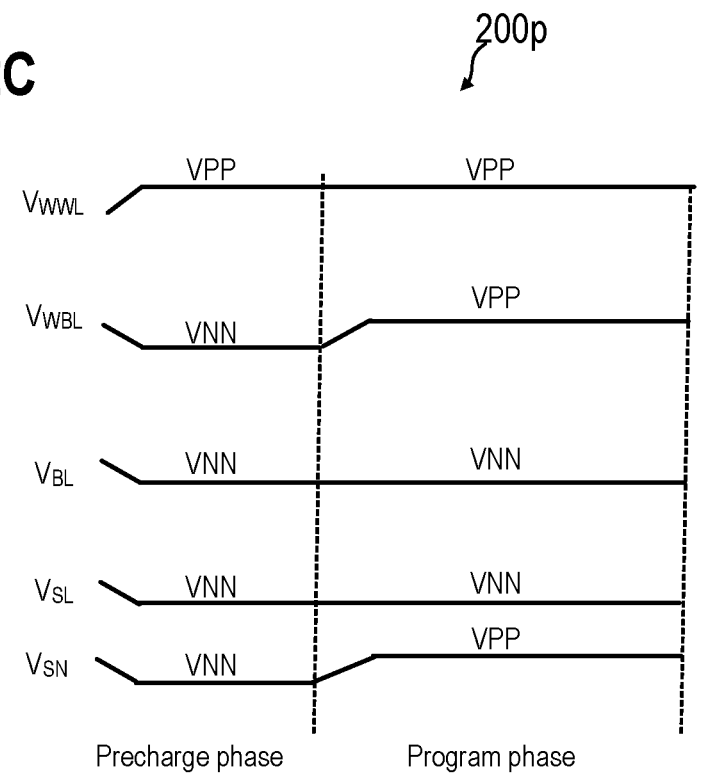
FIG. 2C and FIG. 2D show, in a schematic view, various aspects of voltage schemes for operating a memory cell that has a two-element configuration.

FIG. 2C shows a voltage scheme 200p including the word-line voltage $V_{WWL}$, the operating-line voltage $V_{WBL}$, the source-line voltage $V_{SL}$, the bit-line voltage $V_{BL}$, and the resulting gate voltage $V_{SN}$ during a program operation for programming the memory cell 200, according to various aspects. The program operation may include, as illustrated in FIG. 2C, a pre-program operation (also referred to as pre-charge phase) and an actual program operation (also referred to as program phase). Two voltage levels may be used to operate the memory cell 200, e.g., a first supply voltage level (e.g., VPP) and a second supply voltage level (e.g., VNN). The second supply voltage level may be a negative voltage. The first supply voltage level may be a positive voltage. According to various aspects, the voltage difference and/or the absolute value of the voltage difference (VPP–VNN) may be greater than a programming voltage and/or the absolute value of a programming voltage associated with the memory structure 220, 220t, FeFET of the memory cell 200. The programming voltage of the memory structure 220, 220t, FeFET may be a voltage that can be used to reliably change the memory state of the memory structure 220, 220t, FeFET.

During the pre-charge phase, the word-line voltage $V_{WWL}$ may be set (e.g., charged) to the first supply voltage level VPP and the other voltages (the operating-line voltage $V_{WBL}$, the source-line voltage $V_{SL}$, and the bit-line voltage $V_{BL}$) may be set (e.g., charged) to the second supply voltage level VNN. Accordingly, the resulting voltage at the gate 220g of the memory structure 220, 220t, FeFET is VNN during the pre-charge phase. The pre-charging of the gate 220g of the memory structure 220, 220t, FeFET allows for operating the memory cell 200 in a memory array by a voltage transfer through the access device 230, 230t, FET.

During the program phase, the word-line voltage $V_{WWL}$ may be set to (e.g., charged to and/or remain at) the first supply voltage level VPP. The operating-line voltage $V_{WBL}$ may be set (e.g., charged) to the first supply voltage level VPP. Accordingly, the resulting voltage at the gate 220g of the memory structure 220, 220t, FeFET is VPP–Vth during the program phase. The source-line voltage $V_{SL}$ and the bit-line voltage $V_{BL}$ may be set (e.g., charged) to or may remain at the second supply voltage level VNN. Accordingly, the resulting voltage drop over the memory structure 220, 220t, FeFET may be $V_{DROP}$=VPP–VNN during the program phase which allows for a programming the memory structure 220, 220t, FeFET and, therefore, the memory cell 200.

According to various aspects, the bulk voltage $V_{BLK}$, if accessible, may be set to (e.g., charged to and/or remain at) the second supply voltage level VNN during both the pre-charge phase and the program phase.

Figure 2D:
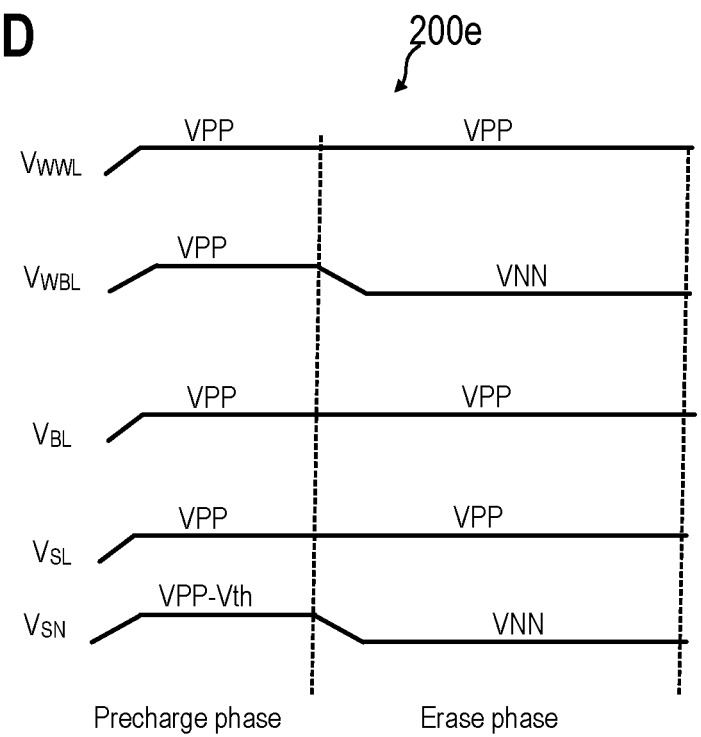

FIG. 2D shows a voltage scheme 200e including the word-line voltage $V_{WWL}$, the operating-line voltage $V_{WBL}$, the source-line voltage $V_{SL}$, the bit-line voltage $V_{BL}$, and the resulting gate voltage $V_{SN}$ during an erase operation for erasing the memory cell 200, according to various aspects. The erase operation may include, as illustrated in FIG. 2D, a pre-erase operation (also referred to as pre-charge phase) and an actual erase operation (also referred to as erase phase). Two voltage levels may be used to operate the memory cell 200, e.g., a first supply voltage level (e.g., VPP) and a second supply voltage level (e.g., VNN). The second supply voltage level may be a negative voltage. The first supply voltage level may be a positive voltage. According to various aspects, the voltage difference and/or the absolute value of the voltage difference (VPP–VNN) may be greater than an erase voltage and/or the absolute value of an erase voltage associated with the memory structure 220, 220t, FeFET of the memory cell 200. The erase voltage of the memory structure 220, 220t, FeFET may be a voltage that can be used to reliably change the memory state of the memory structure 220, 220t, FeFET. According to various aspects, the erase voltage of the memory structure 220, 220t, FeFET have the same absolute voltage value as the programming voltage but opposite polarity with reference to the voltage drop over the memory structure 220, 220t, FeFET.

During the pre-charge phase, the four voltages at the four-nodes of the memory cell 200 (i.e., the word-line voltage $V_{WWL}$, the operating-line voltage $V_{WBL}$, the source-line voltage $V_{SL}$, and the bit-line voltage $V_{BL}$) may be set (e.g., charged) to the first supply voltage level VPP. Accordingly, the resulting voltage at the gate 220g of the memory structure 220, 220t, FeFET may be VPP–Vth during the pre-charge phase. This pre-charging allows for operating the memory cell 200 in a memory array.

According to various aspects, the voltage Vth may be a threshold voltage associated with the access device 230, 230t, FET, if the access device is, for example, a field-effect-transistor. Otherwise, the voltage Vth may be zero and the resulting voltage at the gate 220g of the memory structure 220, 220t, FeFET may be, for example, VPP during the pre-charge phase.

During the erase phase, the word-line voltage $V_{WWL}$ may be set to (e.g., charged to and/or remain at) the first supply voltage level VPP. The operating-line voltage $V_{WBL}$ may be set (e.g., charged) to the second supply voltage level VNN. Accordingly, the resulting voltage at the gate 220g of the memory structure 220, 220t, FeFET is VNN during the erase phase. The source-line voltage $V_{SL}$ and the bit-line voltage $V_{BL}$ may be set (e.g., charged) to or may remain at the first supply voltage level VPP. Accordingly, the resulting voltage drop over the memory structure 220, 220t, FeFET is $V_{DROP}$=VNN−VPP during the program phase which allows for an erasing the memory structure 220, 220t, FeFET and, therefore, the memory cell 200.

According to various aspects, the bulk voltage $V_{BLK}$, if accessible, may be set (e.g., charged) to the first supply voltage level VPP or second supply voltage level VNN during the pre-charge phase and may be set to (e.g., charged to and/or remain at) the second supply voltage level VNN during the erase phase.

During a read operation to read a memory state of the memory cell 200, the word-line voltage $V_{WWL}$ and the operating-line voltage $V_{WBL}$ may be set to a read voltage level VREAD such that the resulting voltage at the gate 220g of the memory structure 220, 220t, FeFET is VREAD−Vth during the read operation. Vth may denote a threshold voltage associated with the access device 230, 230t, FET, if the access device is, for example, a field-effect-transistor. Otherwise, the threshold voltage Vth may be zero and the resulting voltage at the gate 220g of the memory structure 220, 220t, FeFET may be VREAD during the read operation. A current between the source-line node 221 and the bit-line node 223 may flow as a function of the memory state of the of the memory structure 220, 220t, FeFET and the resulting voltage at the gate 220g of the memory structure 220, 220t, FeFET. The current flow between the source-line node 221 and the bit-line node 223 may be used to distinguish between various possible memory states of the memory structure 220, 220t, FeFET and thus to identify an actual memory state in which the memory structure 220, 220t, FeFET (and therefore the memory cell 200) is residing in.

A memory cell 200 that is selected to be read or written may referred to as selected memory cell. A nodes and/or control lines associated with a selected memory cell may be referred to as active nodes and/or active control lines, e.g., an active source-line and an active source-line node 221, an active bit-line and an active bit-line node 223, an active word-line and an active word-line node 231, and an active operating-line and an active operating-line node 233. All other control lines may be referred to as passive control lines. The passive control lines may be used to inhibit read and/or writing of non-selected memory cells (i.e., memory cells of a memory cell arrangement that are not intended to be operated, e.g., not intended to be read and/or written). In the following, various aspects of a memory cell arrangement are described, the memory cell arrangement includes a plurality of memory cells, e.g., memory cells 200 as described herein.

Figure 3A:
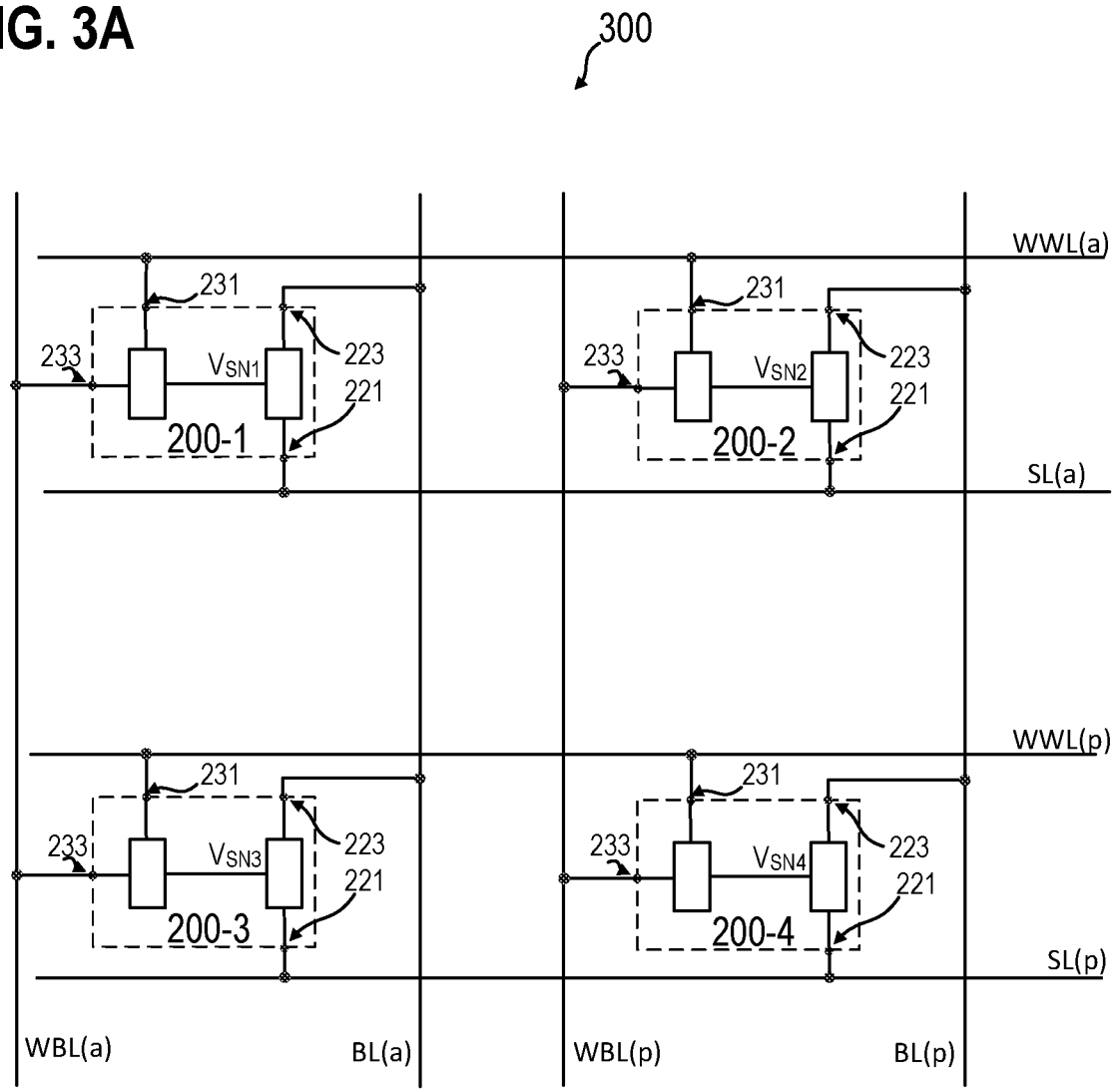

FIG. 3A shows a memory cell arrangement 300 in a schematic view, according to various aspects. The memory cell arrangement 300 may include a plurality of memory cells 200, e.g., exemplarily illustrated four memory cell 200-1, 200-2, 200-3, 200-4 only as example. The plurality of memory cells 200 are connected to control lines to address one or more or all memory cells of the plurality of memory cells 200 of the memory cell arrangement 300. FIG. 3A shows exemplarily four types of control lines: word-lines WWL(WWL(a), WWL(p)), operating-lines WBL(WBL(a), WBL(p)), source-lines SL(SL(a), SL(p)), and bit-lines BL(BL(a), BL(p)), only as example. In this exemplary configuration, a first memory cell 200-1 may be selected to be operated (e.g., written or read) and is therefore referred to as selected or active memory cell. The control lines to address the active memory cell 200-1 are referred to as active control lines, e.g., active word-line WWL(a), active operating-line WBL(a), active source-line SL(a), and active bit-line BL(a). The control lines to address the non-selected (passive) memory cell 200-2, 200-3, 200-4 (e.g., not intended to be written or read) are referred to as passive control lines, e.g., passive word-line WWL(p), passive operating-line WBL(p), passive source-line SL(p), and passive bit-line BL(p).

It is noted that a memory cell arrangement is usually configured in a matrix-type arrangement, wherein columns and rows define the addressing of the memory cells according to the control lines connecting respectively subsets of memory cells of the memory cell arrangement along the rows and columns of the matrix-type arrangement. However, other arrangements may be suitable as well.

FIG. 3B shows a memory cell arrangement 300 similar to the memory cell arrangement shown in FIG. 3A in a configuration with a shared source-line SL(a/p), i.e., at least two (e.g., neighboring) rows of memory cells share a source-line SL(a/p).

FIG. 3C shows a memory cell arrangement 300 similar to the memory cell arrangement shown in FIG. 3A and FIG. 3B in a configuration with a shared source-line SL(a/p) and a share bit-line BL(a/p), i.e., at least two (e.g., neighboring) rows of memory cells share a source-line SL(a/p) and at least two (e.g., neighboring) columns of memory cells share a bit-line BL(a/p).

According to various aspects, to describe the memory cell arrangement 300 and its operation, one or more memory cells may be denoted as active memory cells and one or more memory cells may be denoted as passive memory cells. Furthermore, the corresponding control lines may be denoted as active and passive control lines accordingly. An active memory cell may be connected to four active control lines (see memory cell 200-1); a passive memory cell may be connected to either two passive control lines (see memory cells 200-2, 200-3) or four passive control lines (see memory cell 200-4). However, it is clear that the denomination of the memory cells and control lines as active or passive is only for illustrative an operation of the memory cell arrangement 300, e.g., for illustrating a writing or reading of a selected memory cell (see memory cell 200-1) of the memory cell arrangement 300 without disturbing (e.g., without unintentional reading and/or writing) the other non-selected memory cells (see memory cells 200-2, 200-3, 200-4).

According to various aspects, with respect to the corresponding control lines, the memory cells may form subsets. Various aspects are described in the following with reference to various subsets of memory cells of the plurality of memory cells 200 of the memory cell arrangement 300.

According to various aspects, memory cells of a first subset of the plurality of memory cells (e.g., memory cells 200-1, 200-2, e.g., a first row of memory cells of the memory cell arrangement 300) share a first word-line (e.g., WWL(a)) electrically connected to respective word-line nodes 231 of the memory cells of the first subset. According to various aspects, memory cells of a first subset of the plurality of memory cells (e.g., memory cells 200-1, 200-2, e.g., a first row of memory cells of the memory cell arrangement 300) share a first source-line (e.g., SL(a)) electrically connected to respective source-line nodes 221 of the memory cells of the first subset.

According to various aspects, memory cells of a second subset of the plurality of memory cells (e.g., memory cells 200-3, 200-4, e.g., a second row of memory cells of the memory cell arrangement 300) share a second word-line (e.g., WWL(p)) electrically connected to respective word-line nodes 231 of the memory cells of the second subset. According to various aspects, memory cells of a second subset of the plurality of memory cells (e.g., memory cells 200-3, 200-4, e.g., a second row of memory cells of the memory cell arrangement 300) share a second source-line (e.g., SL(p)) electrically connected to respective source-line nodes 221 of the memory cells of the second subset.

According to various aspects, memory cells of a third subset of the plurality of memory cells (e.g., memory cells 200-1, 200-3, e.g., a first column of memory cells of the memory cell arrangement 300) share a first bit-line (e.g., BL(a)) electrically connected to respective bit-line nodes 223 of the memory cells of the third subset. According to various aspects, memory cells of a third subset of the plurality of memory cells (e.g., memory cells 200-1, 200-3, e.g., a first column of memory cells of the memory cell arrangement 300) share a first operating-line (e.g., WBL(a)) electrically connected to respective operating-line nodes 233 of the memory cells of the third subset.

According to various aspects, memory cells of a fourth subset of the plurality of memory cells (e.g., memory cells 200-2, 200-4, e.g., a second column of memory cells of the memory cell arrangement 300) share a second bit-line (e.g., BL(p)) electrically connected to respective bit-line nodes 223 of the memory cells of the fourth subset. According to various aspects, memory cells of a fourth subset of the plurality of memory cells (e.g., memory cells 200-2, 200-4, e.g., a second column of memory cells of the memory cell arrangement 300) share a second operating-line (e.g., WBL(p)) electrically connected to respective operating-line nodes 233 of the memory cells of the third subset.

According to various aspects, as illustrated in FIG. 3C, memory cells of a first subset of the plurality of memory cells (e.g., memory cells 200-1, 200-2, e.g., a first row of memory cells of the memory cell arrangement 300) and memory cells of a second subset of the plurality of memory cells (e.g., memory cells 200-3, 200-4, e.g., a second row of memory cells of the memory cell arrangement 300) share a bit-line BL(a/p) electrically connected to respective bit-line nodes 223 of the memory cells of the first subset and the second subset. In other words, memory cells of a third subset of the plurality of memory cells (e.g., memory cells 200-1, 200-3, e.g., a first column of memory cells of the memory cell arrangement 300) and memory cells of a fourth subset of the plurality of memory cells (e.g., memory cells 200-2, 200-4, e.g., a second column of memory cells of the memory cell arrangement 300) share a bit-line BL(a/p) electrically connected to respective bit-line nodes 223 of the memory cells of the third subset and the fourth subset. Illustratively, memory cells of two or more or columns of the memory cell arrangement 300 may share the same bit-line BL(a/p).

According to various aspects, as illustrated in FIG. 3B and FIG. 3C, memory cells of a first subset of the plurality of memory cells (e.g., memory cells 200-1, 200-2, e.g., a first row of memory cells of the memory cell arrangement 300) and memory cells of a second subset of the plurality of memory cells (e.g., memory cells 200-3, 200-4, e.g., a second row of memory cells of the memory cell arrangement 300) share a source-line SL(a/p) electrically connected to respective source-line nodes 221 of the memory cells of the first subset and the second subset. In other words, memory cells of a third subset of the plurality of memory cells (e.g., memory cells 200-1, 200-3, e.g., a first column of memory cells of the memory cell arrangement 300) and memory cells of a fourth subset of the plurality of memory cells (e.g., memory cells 200-2, 200-4, e.g., a second column of memory cells of the memory cell arrangement 300) share a source-line SL(a/p) electrically connected to respective source-line nodes 221 of the memory cells of the third subset and the fourth subset. Illustratively, memory cells of two or more or rows of the memory cell arrangement 300 may share the same source-line SL(a/p).

According to various aspects, the memory cell arrangement 300 may include a memory control circuit 310. The memory control circuit 310 may be configured to write (e.g., program, e.g., erase) a selected memory cell of the plurality of memory cells and to inhibit writing of one or more non-selected memory cells of the plurality of memory cells by a pre-write operation and a write operation subsequent to the pre-write operation (see FIG. 2C and FIG. 2D as well as FIG. 4A to FIG. 4D). The memory control circuit may be configured to read a selected memory cell of the memory cell arrangement 300 by a read operation.

According to various aspects, the memory control circuit 310 may be configured to provide one or more sets of voltage levels to operate the memory cell arrangement 300, e.g., a first supply voltage level VPP, a second supply voltage level VNN, an third supply voltage level VINH (e.g., an inhibit voltage level), a bulk-voltage $V_{BLK}$ optionally supplied to one or more bulk nodes of each of the memory cells of the memory cell arrangement 300, a base voltage level or ground VSS, a read voltage level VREAD, and a fourth supply voltage level VDD. According to various aspects, a writing operation may be provided based on only two voltage levels (e.g., VPP and VNN), see, for example, FIG. 4A, FIG. 4C. Optionally, a third voltage level (e.g., VINH) may be used in the program operation, see FIG. 4B, FIG. 4D. According to various aspects, a read operation may be provided based on two, three, or four voltage levels (e.g., VREAD, VNN, VDD, VSS, and VINH), see FIG. 4F.

FIG. 4A and FIG. 4B each show a voltage scheme 400p, e.g., implemented in and/or caused by the control circuit 310, for programming a selected memory cell (e.g., memory cell 200-1) of the memory cell arrangement 300, and, at the same time, prevent a writing of non-selected memory cells (e.g., memory cells 200-2, 200-3, 200-4) of the memory cell arrangement 300 during the programming of the selected memory cell. The voltage scheme 400p includes the active word-line voltage $V_{WWL(a)}$ supplied to the active word-line WWL(a) of the memory cell arrangement 300 and the passive word-line voltage $V_{WWL(p)})$ supplied to the passive word-line WWL(p) of the memory cell arrangement 300. The voltage scheme 400p further includes the active operating-line voltage $V_{WBL(a)}$ supplied to the active operating-line WBL(a) of the memory cell arrangement 300 and the passive operating-line voltage $V_{WBL(p)}$ supplied to the passive operating-line WBL(p) of the memory cell arrangement 300. The voltage scheme 400p further includes the active source-line voltage $V_{SL(a)}$ supplied to the active source-line SL(a) of the memory cell arrangement 300 and the passive source-line voltage $V_{SL(p)}$ supplied to the passive source-line SL(p) of the memory cell arrangement 300. The voltage scheme 400p further includes the active bit-line voltage $V_{BL(a)}$ supplied to the active bit-line BL(a) of the memory cell arrangement 300 and the passive bit-line voltage $V_{BL(p)}$ supplied to the passive bit-line BL(p) of the memory cell arrangement 300. Furthermore, the voltage scheme 400p illustrates resulting gate voltages $V_{SN1}$, $V_{SN2}$, $V_{SN3}$, $V_{SN4}$ during a program operation. The program operation may include, as illustrated, a pre-program operation (also referred to as pre-charge phase) and an actual program operation (also referred to as program phase). Two voltage levels may be used to operate the memory cell 200, e.g., a first supply voltage (e.g., VPP) and a second supply voltage (e.g., VNN), see FIG. 4A. Optionally, an additional voltage level (e.g., an inhibit voltage VINH) may be used, as illustrated in FIG. 4B. The second supply voltage may be a negative voltage. The first supply voltage may be a positive voltage. According to various aspects, the voltage difference and/or the absolute value of the voltage difference (VPP−VNN) may be greater than a programming voltage and/or the absolute value of a programming voltage associated with the memory structure (e.g., the memory structure 220, 220t, FeFET) of the memory cells of the memory cell arrangement 300. The programming voltage of the memory structure may be a voltage that can be used to reliably change the memory state of the memory structure 220, 220t, FeFET and thus the memory state of the respectively selected memory cell.

During the pre-charge phase, the active word-line voltage $V_{WWL(a)}$ may be set (e.g., charged) to the first supply voltage level VPP; the passive word-line voltage $V_{WWL(p)}$ may be set (e.g., charged) to the first supply voltage level VPP. The other voltages (the active operating-line voltage $V_{WBL(a)}$ and passive operating-line voltage $V_{SL(p)}$, the active source-line voltage $V_{SL(a)}$ and the passive source-line voltage $V_{SL(p)}$, as well as the active bit-line voltage $V_{SL(a)}$ and the passive bit-line voltage $V_{BL(p)}$ may be set (e.g., charged) to the second supply voltage level VNN. Accordingly, during the pre-charge phase, the resulting voltages $V_{SN1}$, $V_{SN2}$, $V_{SN3}$, $V_{SN4}$ at the gates 220g of the respective memory structures 220, 220t, FeFET of the memory cells of the memory cell arrangement 300 may be at the second supply voltage level VNN.

During the program phase, the active word-line voltage $V_{WWL(a)}$ may be set to (e.g., charged to and/or remain at) the first supply voltage level VPP. In the case that only two voltage levels VNN, VPP are used, the passive word-line voltage $V_{WWL(p)}$ may be set to (e.g., charged to) the second supply voltage level VNN (see FIG. 4A); or, in the case that three voltage levels VNN, VPP, VINH are used, the passive word-line voltage $V_{WWL(p)}$ may be set to (e.g., charged to) the inhibit voltage level VINH (see FIG. 4B).

According to various aspects, using an inhibit voltage level VINH may allow for a reduction of electrical stress on components of the memory cell arrangement 300, e.g., due to a lowering of gate voltage drops over the access device or memory structure of the memory cells of the memory cell arrangement 300.

During the program phase, the active operating-line voltage $V_{WBL(a)}$ may be set (e.g., charged) to the first supply voltage level VPP. Accordingly, the resulting voltage $V_{SN1}$ for the first memory cell 200-1 is VPP−Vth during the program phase. The passive operating-line voltage $V_{WBL(p)}$ may be set to (e.g., remain at) the second supply voltage level VNN.

During the program phase, the active source-line voltage $V_{SL(a)}$ and the passive source-line voltage $V_{SL(p)}$ as well as the active bit-line voltage $V_{BL(a)}$ and the passive bit-line voltage $V_{BL(p)}$ may be set to (e.g., charged to and/or remain at) the second supply voltage level VNN. Accordingly, the resulting voltage drop over the memory structure 220, 220t, FeFET of the selected memory cell 200-1 is $V_{DROP}$=VPP−VNN or $V_{DROP}$=VPP−Vth−VNN) during the program phase which allows for programming the selected memory cell 200-1.

Accordingly, during the program phase, the resulting voltage $V_{SN2}$ for the second memory cell 200-2 may be VNN in the case that passive word-line voltage $V_{WWL(p)}$ is set to the second voltage level VNN (see FIG. 4A). In other aspects, the resulting voltage $V_{SN2}$ for the second memory cell 200-2 may be VINH in the case that the passive word-line voltage $V_{WWL(p)}$ is set to the inhibit voltage level VINH (see FIG. 4B).

Accordingly, during the program phase, the resulting voltage $V_{SN3}$ for the third memory cell 200-3 may be floating F(VNN) (e.g., floating from VNN) in the case that passive word-line voltage $V_{WWL(p)}$ is set to the second voltage level VNN (see FIG. 4A). In other aspects, the resulting voltage $V_{SN3}$ for the third memory cell 200-3 may be VINH−Vth in the case that the passive word-line voltage $V_{WWL(p)}$ is set to the inhibit voltage level VINH (see FIG. 4B).

Accordingly, during the program phase, the resulting voltage $V_{SN4}$ for the fourth memory cell 200-4 may be floating F(VNN) (e.g., floating from VNN) in the case that passive word-line voltage $V_{WWL(p)}$ is set to the second voltage level VNN (see FIG. 4A). In other aspects, the resulting voltage $V_{SN4}$ for the fourth memory cell 200-4 may be VINH−Vth in the case that the passive word-line voltage $V_{WWL(p)}$ is set to the inhibit voltage level VINH and the passive operating-line voltage $V_{WBL(p)}$ is set to the inhibit voltage level VINH; or the resulting voltage $V_{SN4}$ for the fourth memory cell 200-4 may be VNN in the case that the passive word-line voltage $V_{WWL(p)}$ is set to the inhibit voltage level VINH and the passive operating-line voltage $V_{WBL(p)}$ is set to the second voltage level VNN (see FIG. 4B).

According to various aspects, the bulk voltage $V_{BLK}$, if accessible, may be set to (e.g., charged to and/or remain at) the second supply voltage level VNN during both the pre-charge phase and the program phase.

According to various aspects, the voltage scheme 400p for programming a selected memory cell of the memory cell arrangement 300 has the same voltage conditions for the active source-line voltage $V_{SL(a)}$ and the passive source-line voltage $V_{SL(p)}$. Therefore, during programming, the active source-line SL(a) and the passive source-line SL(p) can be configured as a shared (common) source-line SL(a/p) (see FIG. 3B and FIG. 3C). According to various aspects, the voltage scheme 400p for programming a selected memory cell of the memory cell arrangement 300 has the same voltage conditions for the active bit-line voltage $V_{BL(a)}$ and the passive bit-line voltage $V_{BL(p)}$. Therefore, during programming, the active bit-line BL(a) and the passive bit-line BL(p) can be configured as a shared (common) bit-line BL(a/p) (see FIG. 3C).

Figure 4D:
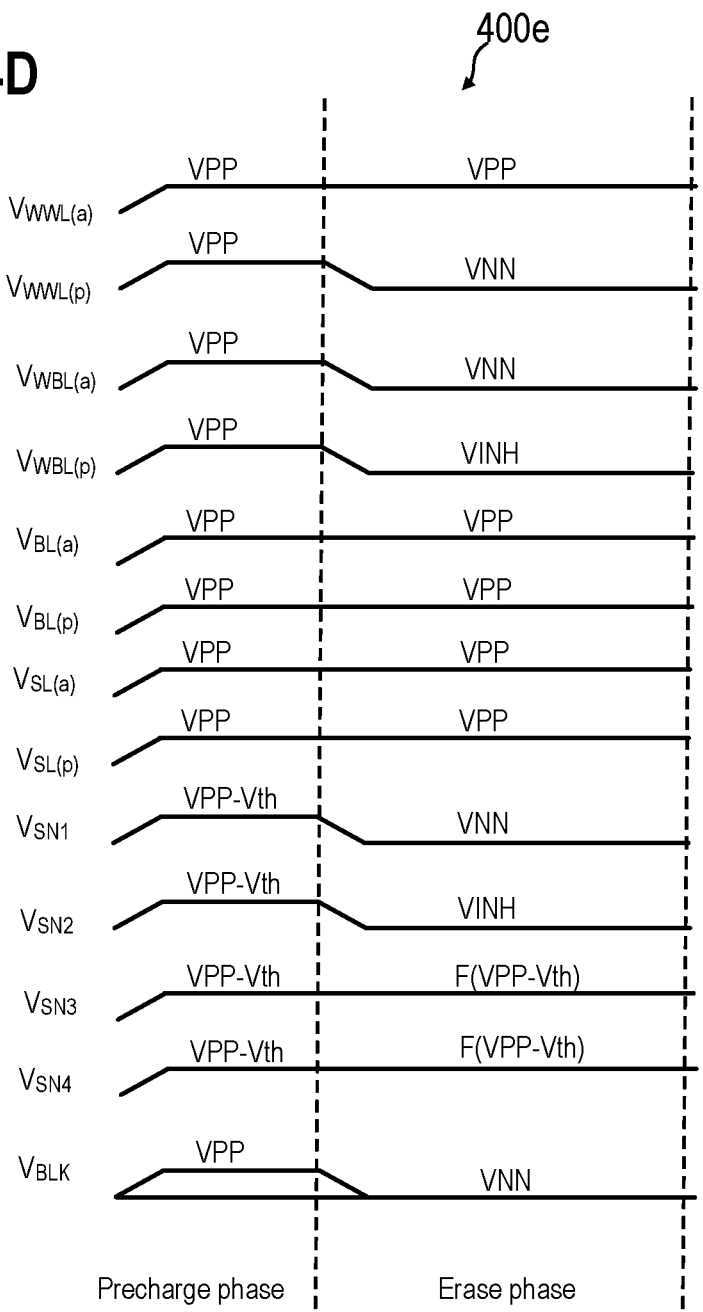

FIG. 4C and FIG. 4D each show a voltage scheme 400e, e.g., implemented in and/or caused by the control circuit 310, for erasing a selected memory cell (e.g., memory cell 200-1) of the memory cell arrangement 300, and, at the same time, prevent a writing of non-selected memory cells (e.g., memory cells 200-2, 200-3, 200-4) of the memory cell arrangement 300 during the erase of the selected memory cell. The voltage scheme 400e includes the active word-line voltage $V_{WWL(a)}$ supplied to the active word-line WWL(a) of the memory cell arrangement 300 and the passive word-line voltage $V_{WWL(p)}$ supplied to the passive word-line WWL(p) of the memory cell arrangement 300. The voltage scheme 400e further includes the active operating-line voltage $V_{WBL(a)}$ supplied to the active operating-line WBL(a) of the memory cell arrangement 300 and the passive operating-line voltage $V_{WBL(p)}$ supplied to the passive operating-line WBL(p) of the memory cell arrangement 300. The voltage scheme 400e further includes the active source-line voltage $V_{SL(a)}$ supplied to the active source-line SL(a) of the memory cell arrangement 300 and the passive source-line voltage $V_{SL(p)}$ supplied to the passive source-line SL(p) of the memory cell arrangement 300. The voltage scheme 400e further includes the active bit-line voltage $V_{BL(a)}$ supplied to the active bit-line BL(a) of the memory cell arrangement 300 and the passive bit-line voltage $V_{BL(p)}$ supplied to the passive bit-line BL(p) of the memory cell arrangement 300. Furthermore, the voltage scheme 400e illustrates resulting gate voltages $V_{SN1}$, $V_{SN2}$, $V_{SN3}$, $V_{SN4}$ during an erase operation. The erase operation may include, as illustrated, a pre-erase operation (also referred to as pre-charge phase) and an actual erase operation (also referred to as erase phase). Two voltage levels may be used to operate the memory cell 200, e.g., a first supply voltage (e.g., VPP) and a second supply voltage (e.g., VNN), see FIG. 4C. Optionally, an additional voltage level (e.g., an inhibit voltage VINH) may be used, as illustrated in FIG. 4D. The second supply voltage may be a negative voltage. The first supply voltage may be a positive voltage. According to various aspects, the voltage difference and/or the absolute value of the voltage difference (VPP–VNN) may be greater than an erase voltage and/or the absolute value of an erase voltage associated with the memory structure (e.g., the memory structure 220, 220t, FeFET) of the memory cells of the memory cell arrangement 300. The erase voltage of the memory structure may be a voltage that can be used to reliably change the memory state of the memory structure 220, 220t, FeFET and thus the memory state of the respectively selected memory cell.

During the pre-charge phase, the eight control lines voltages (e.g., the active word-line voltage $V_{WWL(a)}$, passive word-line voltage $V_{WWL(p)}$, the active operating-line voltage $V_{WBL(a)}$, passive operating-line voltage $V_{WBL(p)}$, the active source-line voltage $V_{SL(a)}$, passive source-line voltage $V_{SL(p)}$, active bit-line voltage $V_{BL(a)}$, passive bit-line voltage $V_{BL(p)}$) may be set (e.g., charged) to the first supply voltage level VPP. Accordingly, during the pre-charge phase, the resulting voltages $V_{SN1}$, $V_{SN2}$, $V_{SN3}$, $V_{SN4}$ at the gates 220g of the respective memory structures 220, 220t, FeFET of the memory cells of the memory cell arrangement 300 may be at a voltage level VPP–Vth.

During the erase phase, the active word-line voltage $V_{WWL(a)}$ may be set to (e.g., charged to and/or remain at) the first supply voltage level VPP and the passive word-line voltage $V_{WWL(p)}$ may be set to (e.g., charged to) the second supply voltage level VNN. The active operating-line voltage $V_{WBL(a)}$ may be set to (e.g., charged to) the second supply voltage level VNN. Accordingly, the resulting voltage $V_{SN1}$ for the first memory cell 200-1 is VNN during the erase phase. In the case that only two voltage levels VNN, VPP are used, the passive operating-line voltage $V_{WBL(p)}$ may be set to (e.g., charged to and/or remain at) the first supply voltage level VPP (see FIG. 4C); or, in the case that three voltage levels VNN, VPP, VINH are used, the passive operating-line voltage $V_{WBL(p)}$ may be set to (e.g., charged to) the inhibit voltage level VINH (see FIG. 4D).

During the erase phase, the active source-line voltage $V_{SL(a)}$ and the passive source-line voltage $V_{SL(p)}$ as well as the active bit-line voltage $V_{BL(a)}$ and the passive bit-line voltage $V_{BL(p)}$ may be set to (e.g., charged to and/or remain at) the first supply voltage level VPP. Accordingly, the resulting voltage drop over the memory structure 220, 220t, FeFET of the selected memory cell 200-1 is $V_{DROP}$=VNN–VPP during the erase phase (e.g., with opposite polarity as provided during the program phase) which allows for an erasing the selected memory cell 200-1.

Accordingly, during the erase phase, the resulting voltage $V_{SN2}$ for the second memory cell 200-2 may be VPP in the case that passive operating-line voltage $V_{WBL(p)}$ is set to the first voltage level VPP (see FIG. 4C). In other aspects, the resulting voltage $V_{SN2}$ for the second memory cell 200-2 may be VINH in the case that the passive operating-line voltage $V_{WBL(p)}$ is set to the inhibit voltage level VINH (see FIG. 4D).

Accordingly, during the erase phase, the resulting voltage $V_{SN3}$ for the third memory cell 200-3 may be floating F(VPP–Vth) (e.g., floating from VPP–Vth). Accordingly, during the erase phase, the resulting voltage $V_{SN4}$ for the fourth memory cell 200-4 may be floating F(VPP–Vth) (e.g., floating from VPP–Vth).

According to various aspects, the bulk voltage $V_{BLK}$, if accessible, may be set to (e.g., charged to and/or remain at) the second supply voltage level VNN during both the pre-charge phase and the erase phase. In other aspects, e.g., to realize a positive source drain erase and prevent leakage through the field-effect transistor structures of the memory cells, the bulk voltage $V_{BLK}$, if accessible, may be set to (e.g., charged to and/or remain at) the first supply voltage level VPP during the pre-charge phase and to the second supply voltage level VNN during the erase phase.

According to various aspects, the voltage scheme 400e for erasing a selected memory cell of the memory cell arrangement 300 has the same voltage conditions for the active source-line voltage $V_{SL(a)}$ and the passive source-line voltage $V_{SL(p)}$. Therefore, during erasing, the active source-line SL(a) and the passive source-line SL(p) can be configured as a shared (common) source-line SL(a/p) (see FIG. 3B and FIG. 3C). According to various aspects, the voltage scheme 400e for erasing a selected memory cell of the memory cell arrangement 300 has the same voltage conditions for the active bit-line voltage $V_{BL(a)}$ and the passive bit-line voltage $V_{BL(p)}$. Therefore, during erasing, the active bit-line BL(a) and the passive bit-line BL(p) can be configured as a shared (common) bit-line BL(a/p) (see FIG. 3C).

According to various aspects, the proposed writing schemes associated with the memory cell arrangement 300, e.g., the voltage scheme 400p for programming and the voltage scheme 400e for erasing a selected memory cell 200-1 of the memory cell arrangement 300, may allow for sharing source-lines and/or sharing bit-lines. This may save process steps during manufacturing. This may save footprint on a wafer. This may allow for a lower number of peripheral circuits (e.g., a reduced number of read-out circuits), e.g., non-shared bit-lines may each have a readout circuit (e.g., a read out amplifier and a comparator) associated therewith so that the number of readout circuits equals the number of non-shared bit-lines (e.g., the number of columns in a memory cell array), e.g., shared bit-lines may have a readout circuit (e.g., a read out amplifier and a comparator) associated therewith as well but the number of readout circuits is (due to sharing) less than the number of columns in a memory cell array.

Various aspects of a memory cell arrangement and writing a memory cell of a memory cell arrangement are described in the following with reference to the memory cell arrangement 300 and its operating described above.

To program a memory cell, as an example, VPP voltage (which may be the highest voltage in the programming voltage scheme) may be applied on the write-word-line (WWL) and the write-bit-line (WBL), which will transfer a voltage of VPP–Vth on a FeFET gate of a memory cell through an access transistor. The bit-line (BL) and the source-line (SL) are set to VNN (which may be the lowest, or most negative, voltage in the programming voltage scheme). In the case that the CMOS technology provides electrical access to the bulk, all bulks may be connected to VNN or a voltage significantly similar to VNN but such that no diode from bulk to any source/drain region is forward biased.

In some aspects, all passive memory cells on the same row as the cell to be programmed may see, with respect to the FeFET, VNN voltage as gate-source voltage (VGS) and gate-drain voltage (VGD) and as gate-channel voltage (VGC) in case there's an electrical access to the bulk, preventing them to be programmed. All the other cells on other rows may have the FeFET-gate floating, and the drain, source, channel voltage of the FeFET equal to VNN, preventing them to be programmed provided the gates of the FeFETs are discharged prior to rise the VPP voltage as shown in FIG. 4A.

In other aspects, all passive memory cells on the same row as the cell to be programmed may see VIHN−VNN voltage as VGS and VGD and as VGC, preventing them to be programmed when VIHN is properly chosen. The other passive memory cells on other rows have the FeFET-gate biased to VINH−Vth, and the drain voltage, source voltage, and channel voltage equal to VNN, preventing them to be programmed provided the gates of the FeFETs are discharged prior to rise the VPP voltage as shown in FIG. 4B.

In some aspects, two voltage levels (VPP, VNN) may be required to program a memory cell of the memory cell arrangement. Two or more of the source-lines may be shared. Optionally, an inhibit voltage VINH can be used to add some flexibility in order to avoid stress.

In some aspects, VSS or VIHN may be applied on the write-word-line (WWL) and VNN may be applied to the write-bit-line (WBL) which will transfer VNN on the FeFET-gate through the access transistor to erase a memory cell. The bit-line (BL) and the source-line (SL) may be set to VPP. In case the CMOS technology provides electrical access to the bulk, all bulks may be connected to VNN and an erase may be done, for example, by a Positive-Source-Drain-Erase (PSDES). A benefit may be that a PSDES works very efficient due to a flexibility in the voltage range, e.g., a lower FeFET-gate and bulk voltage may be used for the memory cell to be erased, which will give a higher VGD and VGS.

All memory cells except the memory cell to be erased may see zero volts or an inhibit voltage VINH as VGS and VGD; and VPP−VNN or VINH−VNN as VGC. Before applying an erase sequence, all control-lines may be set to VPP which will transfer VPP−Vth to all gate nodes (SN1, SN2, SN3, SN4). According to various aspects, source-lines may be shared. According to various aspects, bit-lines may be shared. In some aspects, source-lines and bit-lines may be shared.

According to various aspects, a bulk voltage or bulk node may be shared and may be connected selectively to, for example, VNN or VPP.

In some aspects, two voltage levels (VPP, VNN) may be required to erase a memory cell of the memory cell arrangement. All the source-lines may be shared. Optionally, an inhibit voltage VINH can be used to add some flexibility in order to avoid stress.

According to various aspects, the memory cell arrangement 300 and the voltage schemes 400p, 400e may allow for (in contrast to a common AND array) a single bit erase, e.g., by keeping the bulk voltage at VNN and the source, drain of the FeFET at VPP, which is called PSDES. The benefit may be that the gate and bulk voltage of the FeFET can be decreased below VNN if a high VGS and VGD are desired in order to erase a memory cell. This may not be possible in a common AND-array due to a disturb on passive memory cells.

FIG. 4F shows a voltage scheme 400r, e.g., implemented in and/or caused by the control circuit 310, for reading a selected memory cell (e.g., memory cell 200-1) of the memory cell arrangement 300, and, at the same time, prevent a writing of non-selected memory cells (e.g., memory cells 200-2, 200-3, 200-4) of the memory cell arrangement 300 during the reading of the selected memory cell.

The voltage scheme 400r includes the active word-line voltage $V_{WWL(a)}$ supplied to the active word-line WWL(a) of the memory cell arrangement 300 and the passive word-line voltage $V_{WWL(p)}$ supplied to the passive word-line WWL(p) of the memory cell arrangement 300. The voltage scheme 400r further includes the active operating-line voltage $V_{WBL(a)}$ supplied to the active operating-line WBL(a) of the memory cell arrangement 300 and the passive operating-line voltage $V_{WWL(p)}$ supplied to the passive operating-line WBL(p) of the memory cell arrangement 300. The voltage scheme 400r further includes the active source-line voltage $V_{SL(a)}$ supplied to the active source-line SL(a) of the memory cell arrangement 300 and the passive source-line voltage $V_{SL(p)}$ supplied to the passive source-line SL(p) of the memory cell arrangement 300. The voltage scheme 400r further includes the active bit-line voltage $V_{BL(a)}$ supplied to the active bit-line BL(a) of the memory cell arrangement 300 and the passive bit-line voltage $M_{BL(p)}$ supplied to the passive bit-line BL(p) of the memory cell arrangement 300. Furthermore, the voltage scheme 400r illustrates resulting gate voltages $V_{SN1}$, $V_{SN2}$, $V_{SN3}$, $V_{SN4}$ during read operation. The read operation may include, a set of voltage levels, e.g., a read voltage level (e.g., VREAD), a base voltage level (e.g., VSS), an inhibit voltage level (e.g., VINH), and first and second read supply voltage levels (e.g., VDD and VNN).

During a read phase, the active word-line voltage $V_{WWL(a)}$ may be set to (e.g., charged to and/or remain at) the read voltage level VREAD and the passive word-line voltage $V_{WWL(p)}$ may be set to (charged to and/or remain at) the inhibit voltage level VINH. The active operating-line voltage $V_{WBL(a)}$ may be set (e.g., charged) to the read voltage level VREAD. Accordingly, the resulting voltage $V_{SN1}$ for the first memory cell 200-1 is VREAD−Vth during the read phase. The passive operating-line voltage $V_{WBL(p)}$ may be set to (e.g., charged to and/or remain at) the base voltage level VSS or the second read supply voltage level VNN.

According to various aspects, the active bit-line voltage $V_{BL(a)}$ may be sensed during the read phase. The passive bit-line voltage $V_{BL(p)}$ may be floating (F). In some aspects, e.g., if the bit-lines BL(a/p) are shared (see FIG. 3C), the shared bit-line voltage is sensed during the read phase. According to various aspects, the active bit-line BL(a) and the passive bit-line BL(p) are connected to corresponding sense amplifiers. In a similar way, the shared bit-line BL(a/p) may be connected to a corresponding sense amplifier.

During the read phase, the active source-line voltage $V_{SL(a)}$ may be set to (e.g., charged to and/or remain at) the first read supply voltage level VDD and the passive source-line voltage $V_{SL(p)}$ may be set to (e.g., charged to and/or remain at) the inhibit voltage level VINH. In the case that the source-lines SL(a), SL(p) are shared, see FIG. 3B and FIG. 3C, the shared source-line SL(a/p) may be set to (e.g., charged to and/or remain at) the first read supply voltage level VDD.

Accordingly, during the read phase, the resulting voltage $V_{SN2}$ for the second memory cell 200-2 may be VSS in the case that passive operating-line voltage $V_{WBL(p)}$ is set to the base voltage level VSS. In other aspects, the resulting voltage $V_{SN2}$ for the second memory cell 200-2 may be VNN in the case that the passive operating-line voltage $V_{WBL(p)}$ is set to the second read supply voltage level VNN.

Accordingly, during the read phase, the resulting voltage $V_{SN4}$ for the fourth memory cell 200-4 may be VSS in the case that passive operating-line voltage $V_{WBL(p)}$ is set to the base voltage level VSS. In other aspects, the resulting voltage $V_{SN4}$ for the fourth memory cell 200-4 may be VNN in the case that the passive operating-line voltage $V_{WBL(p)}$ is set to the second read supply voltage level VNN.

Accordingly, during the erase phase, the resulting voltage $V_{SN3}$ for the third memory cell 200-3 may be VINH–Vth.

According to various aspects, the bulk voltage $V_{BLK}$, if accessible, may be set to (e.g., charged to and/or remain at) the second read supply voltage level VNN or the base voltage level VSS during the read phase.

According to various aspects, the voltage scheme 400r for reading a selected memory cell of the memory cell arrangement 300 may have the same voltage conditions for the active source-line voltage $V_{SL(a)}$ and the passive source-line voltage $V_{SL(p)}$. Therefore, during reading, the active source-line SL(a) and the passive source-line SL(p) can be configured as a shared (common) source-line SL(a/p) (see FIG. 3B and FIG. 3C). According to various aspects, the voltage scheme 400r for reading a selected memory cell of the memory cell arrangement 300 may have the same voltage conditions for the active bit-line voltage $V_{BL(a)}$ and the passive bit-line voltage $V_{BL(p)}$. Therefore, during reading, the active bit-line BL(a) and the passive bit-line BL(p) can be configured as a shared (common) bit-line BL(a/p) (see FIG. 3C).

According to various aspects, the proposed operating schemes associated with the memory cell arrangement 300, e.g., the voltage scheme 400p for programming, the voltage scheme 400e for erasing, and the voltage scheme 400r for reading a selected memory cell 200-1 of the memory cell arrangement 300, may allow for sharing source-lines and/or sharing bit-lines. Sharing two or more control lines (e.g., source-lines, e.g., bit-lines) may save process steps during manufacturing. Sharing two or more control lines (e.g., source-lines, e.g., bit-lines) may save footprint on a wafer. Sharing two or more control lines (e.g., source-lines, e.g., bit-lines) may allow for a lower number of peripheral circuits (e.g., a reduced number of read-out circuits), e.g., non-shared bit-lines may each have a readout circuit (e.g., a read out amplifier and a comparator) associated therewith so that the number of readout circuits equals the number of non-shared bit-lines (e.g., the number of columns in a memory cell array), e.g., shared bit-lines may have a readout circuit (e.g., a read out amplifier and a comparator) associated therewith as well but the number of readout circuits is (due to sharing) less than the number of columns in a memory cell array.

Various aspects of a memory cell arrangement and reading a memory cell of a memory cell arrangement are described in the following with reference to the memory cell arrangement 300 and its operating described above.

Basically, three voltage levels (VREAD, VSS or VNN, VINH) may be required to bring memory cell of the memory cell arrangement 300 into a read condition. The actual reading current between the source-line nodes and the bit-lines nodes are generated by an appropriate voltage drop based on the active source-line voltage $V_{SL(a)}$ and the active bit-line voltage $V_{BL(a)}$.

According to various aspects, a column leakage from passive memory cells can be reduced significantly by selecting a proper inhibit voltage VINH on the passive source-line SL(p), which may be a benefit compared to a common AND-architecture.

Optionally, the second read supply voltage level VNN can be used for reading a memory cell to add some flexibility in order to avoid unselected columns leakage.

According to various aspects, unselected columns leakage may be negligible, e.g., by setting SN2 and SN4 to the second read supply voltage level VNN through an appropriate access transfer (e.g., during a pre-charge phase associated with the read operation).

Figure 5:
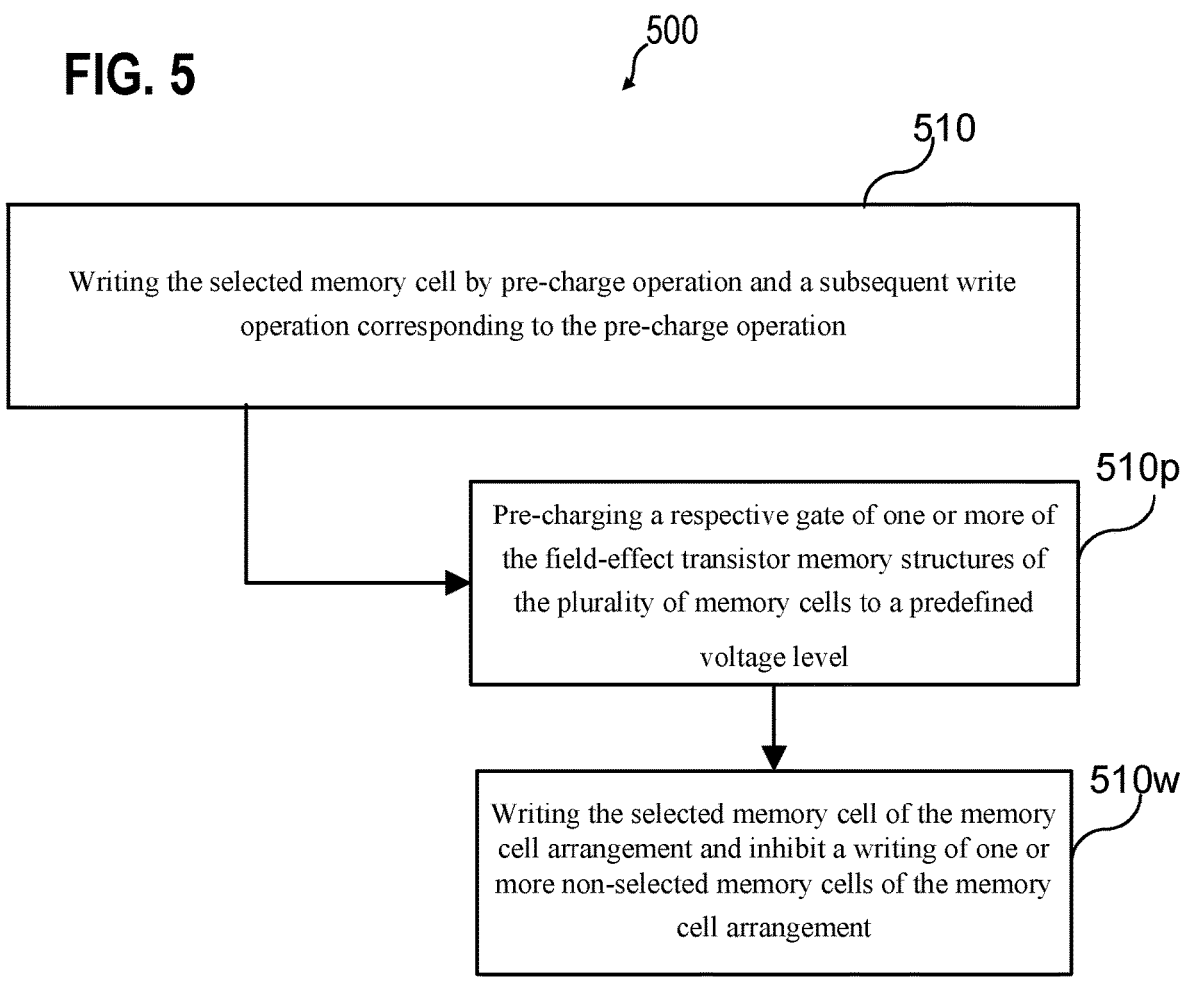
FIG. 5 shows a schematic flow diagram of a method of writing a selected memory cell of a memory cell arrangement, according to various aspects.

FIG. 5 shows a schematic flow diagram of a method 500 for writing a selected memory cell of a memory cell arrangement, according to various aspects. The memory cell arrangement may be configured, for example, as described above with reference to the memory cell arrangement 300. According to various aspects, the method 500 may include, in 510, writing the selected memory cell by pre-charge operation 510p and a subsequent write operation 510w corresponding to the pre-charge operation 510p. During the pre-charge operation 510p, a respective gate of one or more of the field-effect transistor memory structures of the plurality of memory cells is pre-charged to a predefined voltage level by the pre-charge operation, and, during the write operation 510w, the selected memory cell of the memory cell arrangement is written and a writing of one or more non-selected memory cells of the memory cell arrangement is inhibited.

In the following, various examples are provided that refer to the memory cell 200 and memory cell arrangement 300 and the operation of the memory cell 200 and the memory cell arrangement 300.

Example 1 is a memory cell including: a source-line node, a bit-line node, a word-line node, and an operating-line node; a field-effect transistor memory structure including a field-effect transistor structure and memory element, the memory element including a spontaneously polarizable layer, wherein a first source/drain node of the field-effect transistor memory structure is coupled to the source-line node, and wherein a second source/drain node of the field-effect transistor memory structure is coupled to the bit-line node; and an access device, coupled to a gate of the field-effect transistor memory structure, to the word-line node, and to the operating-line node, wherein the access device is configured to control a voltage at the gate of the field-effect transistor memory structure on both a word-line voltage provided at the word-line node and an operating-line voltage provided at the operating-line node.

In Example 2, the memory cell according to Example 1 may optionally include that the field-effect transistor memory structure is configured such that a polarization state of the spontaneously polarizable layer of the memory element defines a memory state of the field-effect transistor memory structure.

In Example 3, the memory cell according to Example 1 or 2 may optionally include that the spontaneously polarizable layer is remanently polarizable.

In Example 4, the memory cell according to any one of Examples 1 to 3 may optionally include that the spontaneously polarizable layer includes at least one remanent polarizable material.

In Example 5, the memory cell according to any one of Examples 1 to 4 may optionally include that a first electrical conductance state associated with the field-effect transistor memory structure corresponds to a polarization state of the spontaneously polarizable layer of the memory element.

In Example 6, the memory cell according to Example 5 may optionally include that a second electrical conductance state distinct from the first electrical conductance state associated with the field-effect transistor memory structure corresponds to a second polarization state of the spontaneously polarizable layer of the memory element.

In Example 7, the memory cell according to Example 6 may optionally include that a transition from the first electrical conductance state to the second electrical conductance state is associated with a change in a residual polarization of the spontaneously polarizable layer of the memory element.

In Example 8, the memory cell according to any one of Examples 1 to 7 may optionally include that the field-effect transistor memory structure includes a capacitive memory structure formed by the memory element and a first electrode layer and a second electrode layer, wherein the memory element is in direct physical contact with both the first electrode and the second electrode.

In Example 9, the memory cell according to any one of Examples 1 to 8 may optionally include that the field-effect transistor memory structure includes a gate electrode layer and a dielectric layer providing the gate of the field-effect transistor memory structure.

In Example 10, the memory cell according to Example 9 may optionally include that the memory element is disposed between the gate electrode layer and the dielectric layer of the field-effect transistor memory structure.

In Example 11, the memory cell according to any one of Examples 1 to 10 may optionally include that the field-effect transistor memory structure includes a gate electrode layer and a channel region.

In Example 12, the memory cell according to Example 11 may optionally include that the memory element is disposed between the gate electrode layer and the channel region of the field-effect transistor memory structure.

In Example 13, the memory cell according to any one of Examples 1 to 8 may optionally include that the field-effect transistor memory structure includes a gate electrode layer and a dielectric layer providing the gate of the field-effect transistor memory structure.

In Example 14, the memory cell according to Example 13 may optionally include that the memory element is in direct physical contact with both the gate electrode layer and the dielectric layer of the field-effect transistor memory structure.

In Example 15, the memory cell according to any one of Examples 1 to 14 may optionally include that the access device includes an access field-effect transistor structure.

In Example 16, the memory cell according to Example 15 may optionally include that a first source/drain node of the access field-effect transistor structure is coupled to the operating-line node.

In Example 17, the memory cell according to Example 15 or 16 may optionally include that a second source/drain node of the access field-effect transistor structure is coupled to the gate of the field-effect transistor memory structure.

In Example 18, the memory cell according to any one of Examples 15 to 17 may optionally include that a gate of the access field-effect transistor structure is coupled to the word-line node.

Example 20 is a memory cell arrangement including a plurality of memory cells according to any one of Examples 1 to 18.

Example 21 is a memory cell arrangement including a plurality of memory cells, each memory cell of the plurality of memory cells includes: a source-line node, a bit-line node, a word-line node, and an operating-line node; a field-effect transistor memory structure including a field-effect transistor structure and memory element, the memory element including a spontaneously polarizable layer, wherein a first source/drain node of the field-effect transistor memory structure is coupled to the source-line node, and wherein a second source/drain node of the field-effect transistor memory structure is coupled to the bit-line node; and an access device, coupled to a gate of the field-effect transistor memory structure, to the word-line node, and to the operating-line node, wherein the access device is configured to control a voltage at the gate of the field-effect transistor memory structure on both a word-line voltage provided at the word-line node and an operating-line voltage provided at the operating-line node.

In Example 22, the memory cell arrangement according to Example 20 or 21 may optionally further include a memory control circuit configured to operate the plurality of memory cells.

In Example 23, the memory cell arrangement according to any one of Examples 20 to 22 may optionally include that memory cells of a first subset of the plurality of memory cells share a first word-line electrically connected to respective word-line nodes of the memory cells of the first subset.

In Example 24, the memory cell arrangement according to any one of Examples 20 to 23 may optionally include that memory cells of a first subset of the plurality of memory cells share a first source-line electrically connected to respective source-line nodes of the memory cells of the first subset.

In Example 25, the memory cell arrangement according to any one of Examples 20 to 24 may optionally include that memory cells of a second subset of the plurality of memory cells share a second word-line electrically connected to respective word-line nodes of the memory cells of the second subset.

In Example 26, the memory cell arrangement according to any one of Examples 20 to 25 may optionally include that memory cells of a second subset of the plurality of memory cells share a second source-line electrically connected to respective source-line nodes of the memory cells of the second subset.

In Example 27, the memory cell arrangement according to any one of Examples 20 to 26 may optionally include that memory cells of a third subset of the plurality of memory cells share a first bit-line electrically connected to respective bit-line nodes of the memory cells of the third subset.

In Example 28, the memory cell arrangement according to any one of Examples 20 to 27 may optionally include that memory cells of a third subset of the plurality of memory cells share a first operating-line electrically connected to respective operating-line nodes of the memory cells of the third subset.

In Example 29, the memory cell arrangement according to any one of Examples 20 to 28 may optionally include that memory cells of a fourth subset of the plurality of memory cells share a second bit-line electrically connected to respective bit-line nodes of the memory cells of the fourth subset.

In Example 30, the memory cell arrangement according to any one of Examples 20 to 29 may optionally include that memory cells of a fourth subset of the plurality of memory cells share a second operating-line electrically connected to respective operating-line nodes of the memory cells of the fourth subset.

In Example 31, the memory cell arrangement according to any one of Examples 20 to 30 may optionally include that memory cells of a first subset and memory cells of a second subset share a bit-line electrically connected to respective bit-line nodes of the memory cells of the first subset and the second subset; and/or that memory cells of a third subset and memory cells of a fourth subset share a bit-line electrically connected to respective bit-line nodes of the memory cells of the third subset and the fourth subset.

In Example 32, the memory cell arrangement according to any one of Examples 20 to 31 may optionally include that memory cells of a first subset and memory cells of a second subset share a source-line electrically connected to respective source-line nodes of the memory cells of the first subset and the second subset; and/or that memory cells of a third subset and memory cells of a fourth subset share a source-line electrically connected to respective source-line nodes of the memory cells of the third subset and the fourth subset.

In Example 33, the memory cell arrangement according to any one of Examples 20 to 32 may optionally include that a memory control circuit or the memory control circuit is configured to write (e.g., program, e.g., erase) a selected memory cell of the plurality of memory cells and to inhibit writing of one or more non-selected memory cells of the plurality of memory cells by a pre-write operation and a write operation subsequent to the pre-write operation.

In Example 34, the memory cell arrangement according to any one of Examples 20 to 33 may optionally include that a memory control circuit or the memory control circuit is configured to read a selected memory cell by a read operation.

In Example 35, the memory cell arrangement according to Example 33 or 34 may optionally include that an active word-line and an active source-line correspond to memory cells of a subset of the plurality of memory cells that includes the selected memory cell; and that one or more passive word-lines and one or more passive source-lines correspond to memory cells of one or more subsets of the plurality of memory cells that does not include the selected memory cell.

In Example 36, the memory cell arrangement according to Example 35 may optionally include that the active source-line and at least one of the one or more passive source-lines are configured as a shared source-line.

According to various aspects, a shared control line (e.g., a shared source-line or a shared bit-line) may include a contiguous structure of an electrically conductive material. According to various aspects, a shared control line (e.g., a shared source-line or a shared bit-line) may include two or more control lines that are electrically conductively connected to one another.

In Example 37, the memory cell arrangement according to Example 35 or 36 may optionally include that an active bit-line and an active operating-line correspond to memory cells of a subset of the plurality of memory cells that includes the selected memory cell; and that one or more passive bit-lines and one or more passive operating-lines correspond to memory cells of one or more subsets of the plurality of memory cells that does not include the selected memory cell.

In Example 38, the memory cell arrangement according to Example 37 may optionally include that the active bit-line and at least one of the one or more passive bit-lines are configured as a shared bit-line.

In Example 39, the memory cell arrangement according to Example 33 or Examples 35 to 38 may optionally include that the pre-write operation includes a pre-program operation, the pre-program operation including: providing a first supply voltage level (e.g., a write voltage, e.g., a programming voltage, e.g., a highest voltage in a pre-write operation and/or write operation) (VPP) at the active word-line and the one or more passive word-lines; providing a second supply voltage level (e.g., a lowest (most negative) voltage in a pre-write operation and/or write operation, e.g., a negative voltage) (VNN) at the active operating-line, the one or more passive operating-lines, the active bit-line, the one or more passive bit-lines, the active source-line, and the one or more passive source-lines.

In Example 40, the memory cell arrangement according to Example 39 may optionally include that the pre-write operation further includes providing the second supply voltage level (VNN) at each bulk node corresponding to memory cells of the plurality of memory cells.

In Example 41, the memory cell arrangement according to Example 33 or Examples 35 to 40 may optionally include that the write operation includes a program operation, the program operation including: providing a first supply voltage level (e.g., a write voltage, e.g., a programming voltage, e.g., a highest voltage in a pre-write operation and/or write operation) (VPP) at the active word-line and the active operating-line; and providing a second supply voltage level (e.g., a lowest (most negative) voltage in a pre-write operation and/or write operation, e.g., a negative voltage) (VNN) or an inhibit voltage (VINH) at each of the one or more passive operating-lines, the active source-line, the one or more passive source-lines, the active bit-line, and the one or more passive bit-lines.

In Example 42, the memory cell arrangement according to Example 41 may optionally include that the write operation further includes providing the second supply voltage level (VNN) at each bulk node corresponding to memory cells of the plurality of memory cells.

In Example 43, the memory cell arrangement according to Example 33 or Examples 35 to 42 may optionally include that the pre-write operation includes a pre-erase operation, the pre-erase operation including: providing a write voltage (VPP) at the active word-line, the one or more passive word-lines; the active operating-line, the one or more passive operating-lines, the active bit-line, the one or more passive bit-lines, the active source-line, and the one or more passive source-lines.

In Example 44, the memory cell arrangement according to Example 43 may optionally include that the pre-erase operation further includes providing the write voltage (VPP) at each bulk node corresponding to memory cells of the plurality of memory cells.

In Example 45, the memory cell arrangement according to Example 33 or Examples 35 to 44 may optionally include that the write operation includes an erase operation, the erase operation including: providing a first supply voltage level (e.g., a write voltage, e.g., a programming voltage, e.g., a highest voltage in a pre-write operation and/or write operation) (VPP) at the active word-line, the active bit-line, the one or more passive bit-lines, the active source-line, and the one or more passive source-lines; providing a first supply voltage level (e.g., a write voltage, e.g., a programming voltage, e.g., a highest voltage in a pre-write operation and/or write operation) (VNN) or an inhibit voltage (VINH) at the one or more passive operating lines; providing a second supply voltage level (e.g., a lowest (most negative) voltage in a pre-write operation and/or write operation, e.g., a negative voltage) (VNN) at the one or more passive word-lines, and the active operating line.

In Example 46, the memory cell arrangement according to Example 45 may optionally include that the erase operation further includes providing the second supply voltage level (VNN) at each bulk node corresponding to memory cells of the plurality of memory cells.

Example 50 is a memory cell including: a field-effect transistor memory structure, wherein a source/drain current through the field-effect transistor memory structure is a function of a gate voltage supplied to a gate of the field-effect transistor memory structure and a memory state in which the field-effect transistor memory structure is residing in; and an access device coupled to the gate of the field-effect transistor memory structure, wherein the access device is configured to control a voltage present at the gate of the field-effect transistor memory structure.

Example 51 is a memory cell arrangement including: a first memory cell including a first field-effect transistor memory structure and a first access device coupled to the first field-effect transistor memory structure to control a voltage at a gate of the first field-effect transistor memory structure; a second memory cell including a second field-effect transistor memory structure and a second access device coupled to the second field-effect transistor memory structure to control a voltage at a gate of the second field-effect transistor memory structure; a third memory cell including a third field-effect transistor memory structure and a third access device coupled to the third field-effect transistor memory structure to control a voltage at a gate of the third field-effect transistor memory structure; a fourth memory cell including a fourth field-effect transistor memory structure and a fourth access device coupled to the fourth field-effect transistor memory structure to control a voltage at a gate of the fourth field-effect transistor memory structure; and a set of access device control lines coupled to the first access device, the second access device, the third access device, and the fourth access device to control a respective switch state of the first access device, the second access device, the third access device, and the fourth access device and to control a first voltage at the gate of the first field-effect transistor memory structure, a second voltage at the gate of the second field-effect transistor memory structure, a third voltage at the gate of the third field-effect transistor memory structure, and a fourth voltage at the gate of the fourth field-effect transistor memory structure; and a common source-line coupled to a respective first source/drain node of each of the first field-effect transistor memory structure, the second field-effect transistor memory structure, the third field-effect transistor memory structure, and the fourth field-effect transistor memory structure to write and/or read the first field-effect transistor memory structure, the second field-effect transistor memory structure, the third field-effect transistor memory structure, and the fourth field-effect transistor memory structure; and a common bit-line coupled to a respective second source/drain node of each of the first field-effect transistor memory structure, the second field-effect transistor memory structure, the third field-effect transistor memory structure, and the fourth field-effect transistor memory structure to write and/or read the first field-effect transistor memory structure, the second field-effect transistor memory structure, the third field-effect transistor memory structure, and the fourth field-effect transistor memory structure.

Example 52 is a method for writing a selected memory cell of a memory cell arrangement, the memory cell arrangement including: a plurality of memory cells, each memory cell of the plurality of memory cells including: a field-effect transistor memory structure connecting a source-line node and a bit-line node of the memory cell with one another, and an access field-effect transistor structure coupled to the field-effect transistor memory structure to control a voltage at a gate of the field-effect transistor memory structure as a function of both a word-line voltage provided to the access field-effect transistor structure via a word-line node of the memory cell and an operating-line voltage provided to the access field-effect transistor structure via an operating-line node of the memory cell; the method including: writing the selected memory cell by pre-charge operation and a subsequent write operation corresponding to the pre-charge operation, wherein a respective gate of one or more of the field-effect transistor memory structures of the plurality of memory cells is pre-charged to a predefined voltage level by the pre-charge operation, and wherein the selected memory cell of a memory cell arrangement is written by the subsequent write operation and wherein a writing of one or more non-selected memory cells of the memory cell arrangement is inhibited during the subsequent write operation.

In Example 53, the method of Example 52 may optionally include that writing the selected memory cell is based on only two distinct supply voltage levels.

In Example 54, the method of Example 52 may optionally include that writing the selected memory cell includes charging all source-line nodes, bit-line nodes, word-line nodes, and operating-line nodes of all memory cells of the plurality of memory cells selectively to one of two supply voltage levels.

In Example 55, the method of Example 52 may optionally include that writing the selected memory cell is based on only three distinct supply voltage levels.

In Example 56, the method of Example 52 may optionally include that writing the selected memory cell includes charging all source-line nodes, bit-line nodes, word-line nodes, and operating-line nodes of all memory cells of the plurality of memory cells selectively to one of three supply voltage levels.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g., the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "spontaneously polarizable material" or "spontaneous-polarizable material" may be used herein with reference to a material or layer that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an antiferroelectric material.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a source-line node, a bit-line node, a word-line node, and an operating-line node;
a field-effect transistor memory structure comprising a field-effect transistor structure and memory element, the memory element comprising a spontaneously polarizable layer, wherein a first source/drain node of the field-effect transistor memory structure is coupled to the source-line node, and wherein a second source/drain node of the field-effect transistor memory structure is coupled to the bit-line node; and
an access device, coupled to a gate of the field-effect transistor memory structure, to the word-line node, and to the operating-line node, wherein the access device is configured to control a voltage at the gate of the field-effect transistor memory structure on both a word-line voltage provided at the word-line node and an operating-line voltage provided at the operating-line node,
wherein a first electrical conductance state associated with the field-effect transistor memory structure corresponds to a polarization state of the spontaneously polarizable layer of the memory element, and
wherein a second electrical conductance state distinct from the first electrical conductance state associated with the field-effect transistor memory structure corresponds to a second polarization state of the spontaneously polarizable layer of the memory element, and
wherein a transition from the first electrical conductance state to the second electrical conductance state is associated with a change in a residual polarization of the spontaneously polarizable layer of the memory element.

2. The memory cell according to claim 1,
wherein the field-effect transistor memory structure is configured such that a polarization state of the spontaneously polarizable layer of the memory element defines a memory state of the field-effect transistor memory structure.

3. The memory cell according to claim 1,
wherein the spontaneously polarizable layer is remanently polarizable.

4. The memory cell according to claim 1,
wherein the spontaneously polarizable layer comprises at least one remanent polarizable material.

5. The memory cell according to claim 1,
wherein the field-effect transistor memory structure comprises a capacitive memory structure formed by the memory element and a first electrode layer and a second electrode layer, wherein the memory element is in direct physical contact with both the first electrode and the second electrode.

6. The memory cell according to claim 1,
wherein the field-effect transistor memory structure comprises a gate electrode layer, a dielectric layer, and a channel region, and wherein at least one of:
the memory element is disposed between the gate electrode layer and the channel region of the field-effect transistor memory structure, and/or
the memory element is in direct physical contact with both the gate electrode layer and the dielectric layer of the field-effect transistor memory structure, and/or
the memory element is disposed between the gate electrode layer and the dielectric layer of the field-effect transistor memory structure.

7. The memory cell according to according to claim 1,
wherein the access device comprises an access field-effect transistor structure, wherein a first source/drain node of the access field-effect transistor structure is coupled to the operating-line node, wherein a second source/drain node of the access field-effect transistor structure is coupled to the gate of the field-effect transistor memory structure, and wherein a gate of the access field-effect transistor structure is coupled to the word-line node.

8. A memory cell arrangement comprising:
a plurality of memory cells, each memory cell of the plurality of memory cells comprising:
a source-line node, a bit-line node, a word-line node, and an operating-line node; a field-effect transistor memory structure comprising a field-effect transistor structure and memory element, the memory element comprising a spontaneously polarizable layer, wherein a first source/drain node of the field-effect transistor memory structure is coupled to the source-line node, and wherein a second source/drain node of the field-effect transistor memory structure is coupled to the bit-line node; and
an access device, coupled to a gate of the field-effect transistor memory structure, to the word-line node, and to the operating-line node, wherein the access device is configured to control a voltage at the gate of the field-effect transistor memory structure on both a word-line voltage provided at the word-line node and an operating-line voltage provided at the operating-line node;
a memory control circuit configured to write a selected memory cell of the plurality of memory cells and to inhibit writing of one or more non-selected memory cells of the plurality of memory cells by a pre-write operation and a write operation subsequent to the pre-write operation.

9. The memory cell arrangement according to claim 8, wherein the memory control circuit is configured to operate the memory cells of the plurality of memory cells.

10. The memory cell arrangement according to claim 8, wherein memory cells of a first subset of the plurality of memory cells share a first word-line electrically connected to respective word-line nodes of the memory cells of the first subset; and/or
wherein memory cells of a first subset of the plurality of memory cells share a first source-line electrically connected to respective source-line nodes of the memory cells of the first sub set.

11. The memory cell arrangement according to claim 8, wherein memory cells of a second subset of the plurality of memory cells share a second word-line electrically connected to respective word-line nodes of the memory cells of the second subset; and/or
wherein memory cells of a second subset of the plurality of memory cells share a second source-line electrically connected to respective source-line nodes of the memory cells of the second subset.

12. The memory cell arrangement according to claim 8, wherein memory cells of a third subset of the plurality of memory cells share a first bit-line electrically connected to respective bit-line nodes of the memory cells of the third subset; and/or
wherein memory cells of a third subset of the plurality of memory cells share a first operating-line electrically connected to respective operating-line nodes of the memory cells of the third subset.

13. The memory cell arrangement according to claim 8, wherein memory cells of a fourth subset of the plurality of memory cells share a second bit-line electrically connected to respective bit-line nodes of the memory cells of the fourth subset; and/or
wherein memory cells of a fourth subset of the plurality of memory cells share a second operating-line electrically connected to respective operating-line nodes of the memory cells of the fourth subset.

14. The memory cell arrangement according to claim 8, wherein memory cells of a first subset of the plurality of memory cells share a first word-line electrically connected to respective word-line nodes of the memory cells of the first subset, and
wherein memory cells of a second subset of the plurality of memory cells share a second word-line electrically connected to respective word-line nodes of the memory cells of the second subset; and
wherein memory cells of the first subset of the plurality of memory cells and memory cells of the second subset of the plurality of memory cells share a common source-line electrically connected to respective source-line nodes of the memory cells of the first subset and of the second subset.

15. The memory cell arrangement according to claim 8, wherein memory cells of a third subset of the plurality of memory cells share a first operating-line electrically connected to respective operating-line nodes of the memory cells of the third subset, and wherein memory cells of a fourth subset of the plurality of memory cells share a second operating-line electrically connected to respective operating-line nodes of the memory cells of the fourth subset; and
wherein memory cells of the third subset of the plurality of memory cells and memory cells of the fourth subset of the plurality of memory cells share a common bit-line electrically connected to respective bit-line nodes of the memory cells of the third subset and of the fourth sub set.

16. The memory cell arrangement according to claim 8, wherein an active bit-line and an active source-line correspond to the selected memory cell, and wherein one or more passive bit-lines and one or more passive source-lines correspond to memory cells of one or more non-selected memory cells, and
wherein at least one of:
the active source-line and at least one of the one or more passive source-lines are configured as a shared source-line, and/or
the active bit-line and at least one of the one or more passive bit-lines are configured as a shared bit-line.

17. The memory cell arrangement according to claim 8, wherein the pre-write operation comprises a pre-program operation, the pre-program operation comprising:
providing a first supply voltage level at the active word-line and the one or more passive word-lines; and
providing a second supply voltage level at the active operating-line, the one or more passive operating-lines, the active bit-line, the one or more passive bit-lines, the active source-line, and the one or more passive source-lines.

18. The memory cell arrangement according to claim 8, wherein the write operation comprises a program operation, the program operation comprising:
providing a first supply voltage level at the active word-line and the active operating-line; and
providing a second supply voltage level or an inhibit voltage at each of the one or more passive operating-lines, the active source-line, the one or more passive source-lines, the active bit-line, and the one or more passive bit-lines.

19. The memory cell arrangement according to claim 8, wherein the pre-write operation comprises a pre-erase operation, the pre-erase operation comprising:
providing a write voltage at the active word-line, the one or more passive word-lines; the active operating-line, the one or more passive operating-lines, the active bit-line, the one or more passive bit-lines, the active source-line, and the one or more passive source-lines.

20. The memory cell arrangement according to claim 8, wherein the write operation comprises an erase operation, the erase operation comprising:
providing a first supply voltage level at the active word-line, the active bit-line, the one or more passive bit-lines, the active source-line, and the one or more passive source-lines; and
providing a first supply voltage level or an inhibit voltage at the one or more passive operating lines; and
providing a second supply voltage level at the one or more passive word-lines, and the active operating line.

21. A method for writing a selected memory cell of a memory cell arrangement, the memory cell arrangement comprising:
a plurality of memory cells, each memory cell of the plurality of memory cells comprising:
a field-effect transistor memory structure connecting a source-line node and a bit-line node of the memory cell with one another, and an access field-effect transistor structure coupled to the field-effect transistor memory structure to control a voltage at a gate of the field-effect transistor memory structure as a function of both a word-line voltage provided to the access field-effect transistor structure via a word-line node of the memory cell and an operating-line voltage provided to the access field-effect transistor structure via an operating-line node of the memory cell;

the method comprising:

writing the selected memory cell by pre-charge operation and a subsequent write operation corresponding to the pre-charge operation, wherein a respective gate of one or more of the field-effect transistor memory structures of the plurality of memory cells is pre-charged to a predefined voltage level by the pre-charge operation, and wherein the selected memory cell of a memory cell arrangement is written by the subsequent write operation and wherein a writing of one or more non-selected memory cells of the memory cell arrangement is inhibited during the subsequent write operation.

22. The method of claim 21;

wherein writing the selected memory cell is based on three or less distinct supply voltage levels.

23. A memory cell arrangement comprising:

a plurality of memory cells, each memory cell of the plurality of memory cells comprising:

a source-line node, a bit-line node, a word-line node, and an operating-line node; a field-effect transistor memory structure comprising a field-effect transistor structure and memory element, the memory element comprising a spontaneously polarizable layer, wherein a first source/drain node of the field-effect transistor memory structure is coupled to the source-line node, and wherein a second source/drain node of the field-effect transistor memory structure is coupled to the bit-line node; and an access device, coupled to a gate of the field-effect transistor memory structure, to the word-line node, and to the operating-line node, wherein the access device is configured to control a voltage at the gate of the field-effect transistor memory structure on both a word-line voltage provided at the word-line node and an operating-line voltage provided at the operating-line node; and wherein memory cells of a subset of the plurality of memory cells share at least one of:

a word-line electrically connected to respective word-line nodes of the memory cells of the subset, a source-line electrically connected to respective source-line nodes of the memory cells of the subset, a bit-line electrically connected to respective bit-line nodes of the memory cells of the subset, and/or an operating-line electrically connected to respective operating-line nodes of the memory cells of the subset.

24. The memory cell arrangement according to claim 23, wherein memory cells of a subset of the plurality of memory cells share a word-line electrically connected to respective word-line nodes of the memory cells of the subset and a source-line electrically connected to respective source-line nodes of the memory cells of the sub set.

25. The memory cell arrangement according to claim 24, wherein memory cells of another subset of the plurality of memory cells share a bit-line electrically connected to respective bit-line nodes of the memory cells of the other subset and an operating-line electrically connected to respective operating-line nodes of the memory cells of the other subset.

* * * * *

UNITED STATES PATENT AND TRADEMARK OFFICE
CERTIFICATE OF CORRECTION

PATENT NO. : 11,443,792 B1
APPLICATION NO. : 17/400411
DATED : September 13, 2022
INVENTOR(S) : Rashid Iqbal et al.

It is certified that error appears in the above-identified patent and that said Letters Patent is hereby corrected as shown below:

In the Claims

Claim 10, Column 33, Line 12 delete "sub set", insert --subset--
Claim 15, Column 34, Line 3 delete "sub set", insert --subset--
Claim 24, Column 36, Line 28 delete "sub set", insert --subset--

Signed and Sealed this
Thirty-first Day of January, 2023

*Katherine Kelly Vidal*

Katherine Kelly Vidal
*Director of the United States Patent and Trademark Office*